United States Patent
Fukuoka et al.

(10) Patent No.: US 7,663,304 B2
(45) Date of Patent: Feb. 16, 2010

(54) ORGANIC ELECTROLUMINESCENCE ELEMENT

(75) Inventors: Kenichi Fukuoka, Sodegaura (JP);
Masahide Matsuura, Sodegaura (JP);
Hiroshi Yamamoto, Sodegaura (JP);
Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 638 days.

(21) Appl. No.: 10/535,310

(22) PCT Filed: Nov. 13, 2003

(86) PCT No.: PCT/JP03/14425

§ 371 (c)(1),
(2), (4) Date: May 18, 2005

(87) PCT Pub. No.: WO2004/047499

PCT Pub. Date: Jun. 3, 2004

(65) Prior Publication Data

US 2006/0043859 A1    Mar. 2, 2006

(30) Foreign Application Priority Data

Nov. 18, 2002  (JP)  ............... 2002-333812
May 29, 2003   (JP)  ............... 2003-152276

(51) Int. Cl.
  *H01L 51/54*  (2006.01)
(52) U.S. Cl. ............... 313/506; 313/504; 428/212; 428/690; 428/917
(58) Field of Classification Search ............ 428/690, 428/917; 313/502–509; 257/40, 80–103, 257/E51.001–E51.052
See application file for complete search history.

(56) References Cited

U.S. PATENT DOCUMENTS 5,503,910 A    4/1996   Matsuura et al. ............ 428/212

(Continued)

FOREIGN PATENT DOCUMENTS

EP    0 643 549    3/1995

(Continued)

OTHER PUBLICATIONS

Machine Translation of JP 2000-068057.*

(Continued)

*Primary Examiner*—Marie R. Yamnitzky
(74) *Attorney, Agent, or Firm*—Steptoe & Johnson LLP

(57) ABSTRACT

An organic electroluminescence element comprising: an anode; a first emitting layer comprising at least a first host material and a first dopant; a second emitting layer comprising at least a second host material and a second dopant; and a cathode in the order mentioned: wherein the energy gap $E_{gh}1$ of the first host material, the energy gap $E_{gd}1$ of the first dopant, the energy gap $E_{gh}2$ of the second host material, and the energy gap $E_{gd}2$ of the second dopant satisfy the following formulas; and the luminescent intensity I1 at the maximum luminescent wavelength of an emission spectrum derived from the first emitting layer, and the luminescent intensity I2 at the maximum luminescent wavelength of an emission spectrum derived from the second emitting layer satisfy the following formula:

$E_{gh}1 > E_{gd}1$ $E_{gh}2 > E_{gd}2$ $E_{gd}1 > E_{gd}2$ $I1 > 3.5 \times I2$.

13 Claims, 3 Drawing Sheets

U.S. PATENT DOCUMENTS

| | | | |
|---|---|---|---|
| 5,536,949 A * | 7/1996 | Hosokawa et al. | 257/40 |
| 5,601,903 A | 2/1997 | Fujii et al. | 428/212 |
| 5,773,130 A | 6/1998 | So et al. | |
| 6,224,966 B1 * | 5/2001 | Sakai et al. | 428/212 |
| 6,285,039 B1 | 9/2001 | Kobori et al. | 257/40 |
| 6,387,546 B1 | 5/2002 | Hamada et al. | 428/690 |
| 6,447,934 B1 | 9/2002 | Suzuki et al. | 428/690 |
| 6,534,199 B1 | 3/2003 | Hosokawa et al. | 428/690 |
| 6,750,472 B2 * | 6/2004 | Suzuki et al. | 257/40 |
| 2001/0043043 A1 | 11/2001 | Aoyama et al. | |
| 2001/0043044 A1 * | 11/2001 | Wakimoto et al. | 313/506 |
| 2001/0052751 A1 * | 12/2001 | Wakimoto et al. | 313/504 |
| 2002/0096995 A1 * | 7/2002 | Mishima et al. | 313/506 |
| 2003/0014119 A1 | 1/2003 | Capon et al. | 623/19.11 |
| 2003/0038287 A1 | 2/2003 | Suzuki et al. | 257/40 |
| 2004/0082813 A1 | 4/2004 | Iwakuma et al. | 564/405 |

FOREIGN PATENT DOCUMENTS

| | | |
|---|---|---|
| EP | 1 182 244 | 2/2002 |
| EP | 1187235 * | 3/2002 |
| JP | 2000-068057 * | 3/2000 |
| JP | 2000-344691 | 12/2000 |
| JP | 2001-118681 | 4/2001 |
| JP | 2001-338761 | 12/2001 |
| JP | 2002-275179 | 9/2002 |
| JP | 2002329578 | 11/2002 |

OTHER PUBLICATIONS

Hosokawa et al., "Highly efficient blue electroluminescence from a distyrylarylene emitting layer with a new dopant," Applied Physics Letters, vol. 67, No. 26, pp. 3853-3855, Dec. 1995.*

* cited by examiner

PRIOR ART

PRIOR ART

ORGANIC ELECTROLUMINESCENCE ELEMENT

The present application is based on International Application PCT/JP03/14425, filed Nov. 13, 2003; which application is incorporated herein by reference in its entirety.

TECHNICAL FIELD

The present invention relates to an organic electroluminescence element and, specifically, an organic electroluminescence element comprising an emitting layer having a bi-layered structure.

BACKGROUND ART

Electroluminescence elements, which uses electroluminescence (electroluminescence being abbreviated to "EL" hereinafter), have a high visibility because of spontaneous emission and further have good features, such as excellent impact resistance, because they are completely solid elements. Therefore, attention has been paid to the use thereof as light emitting elements in various display devices.

The EL elements are classified into inorganic EL elements, wherein an inorganic compound is used for their luminescent material, and organic EL elements, wherein an organic compound is used therefor. In particular, the organic EL elements are being developed as next-generation light emitting elements since the elements enable to reduce the voltage to be applied largely, easily enable the formation of full-color devices, are small in power consumption and make panel-emission possible.

An organic EL element basically has a structure of an anode/an emitting layer/a cathode, as illustrated in FIG. 3.

This organic EL element 10 has an emitting layer 14 sandwiched between a pair of electrodes composed of an anode 12 and a cathode 13. The emitting layer 14 is usually composed of plural laminated layers. When an electric field is applied across the electrodes 12 and 13 in this element 10, electrons are injected from the cathode 13 and holes are injected from the anode 12. The electrons and the holes are recombined in the emitting layer 14 so as to cause an exciting state. When the exciting state returns to a ground state, energy is emitted as light.

FIG. 4 shows an energy diagram of the organic EL element in FIG. 3. In FIG. 4, a valence electron level EV0 (HOMO) and a conduction level EC0 (LUMO), which are energy levels of the emitting layer 14, are shown. Holes go in the layer 14 from the anode 12 and electrons go therein from the cathode 13. The holes and the electrons are combined with each other in the layer 14 so as to emit light.

There is known an element wherein the above-mentioned structure is used as a base and a hole injecting-transporting layer and/or an electron injecting layer are appropriately added, an example of the element being an element having the following structure: an anode/a hole injecting-transporting layer/an emitting layer/a cathode; or an anode/a hole injecting layer/a hole transporting layer/an emitting layer/an electron injecting layer/a cathode.

The emitting layer has the following functions:

(1) Injecting function: a function capable of injecting holes into the layer from an anode or a hole injecting layer, and injecting electrons into the layer from a cathode or an electron injecting layer when an electric field is applied.

(2) Transporting function: a function of transporting the injected charges (electrons and holes) by the electric field.

(3) Light emitting functions: a function of supplying a field where the electrons and the holes are recombined and inducing light emission from this recombination.

The hole injecting-transporting layer has a function of injecting holes into the layer from an anode and transporting the holes into an organic emitting layer. A hole injecting layer and a hole transporting layer may be separately formed. The electron injecting layer has a function of injecting electrons into the layer from a cathode, and transporting the electrons into the organic emitting layer.

In order to make light emission in the emitting layer more intense, a technique of adding a very small amount of a fluorescent molecule (dopant) thereto is known.

FIG. 5 illustrates an energy diagram of an organic EL element to which a dopant is added. In this figure, ECh represents the conduction level of the host thereof; EVh, the valence electron level of the host; ECd, the conduction level of the dopant; and EVd, the valence electron level of the dopant. Egh and Egd represent the energy gap (difference between the ECh and the EVh) of the host and the energy gap (difference between the ECd and the EVd) of the dopant, respectively.

The dopant receives the energy of the excited host effectively so as to enhance the light emitting efficiency.

The method for obtaining multicolor from the luminescence of an organic EL element is roughly classified into the following three methods:

(1) A method of taking out lights of three colors from white luminescence emitted from an organic EL element by using three colors, red, green and blue filters.

(2) A method of converting blue luminescence emitted from an blue EL element to light of other colors by a fluorescent layer formed on the light-taking-out side of its emitting layer.

(3) A method of arranging blue, red and green emitting layers side by side on the same substrate.

For these methods, organic EL elements giving a high luminance and having a long durability have been demanded. For example, for the methods (1) and (2), the following has been earnestly desired: organic EL elements which emit light having a bluish green or white broad band (wide spectrum) and which have a half life of several ten thousands of hours or more for an initial luminance of several hundreds nit.

Various element structures have been investigated for such a desire.

As one method out of them, a method for making an organic emitting layer into plural layers, thereby obtaining white or broad band luminescence is suggested as follows:

(1) A way of making an organic emitting layer into a bi-layered structure, the first emitting layer in the anode side thereof being a blue emitting layer made of an aluminum complex compound, and the second emitting layer in the cathode side being a red emitting layer made of an aluminum complex compound containing a red fluorescent material, thereby taking out white light (see, for example, EP0643549).

(2) A way of making an organic emitting layer into a bi-layered structure, the first emitting layer in the anode side thereof being a blue emitting layer made of a distyrylarylene-based compound, and the second emitting layer in the cathode side being an emitting layer wherein a red fluorescent material is added to an aluminum complex compound emitting green light, thereby taking out white light (see, for example, U.S. Pat. No. 5,503,910).

(3) A way of incorporating coumarin and rubrene as dopants into an emitting layer which is a mixture layer of an electron transporting compound made of an aluminum complex and a hole transporting compound made of a diamine compound, thereby emitting light having a green component and an orange component (see, for example, WO98/08360).

(4) A way of doping a host material made of a distyrylarylene-based compound with two or more fluorescent materials different in color, thereby forming two emitting layers (see, for example, JP-A-12-68057).

These conventional techniques are ways for causing plural kinds of dopants equally to emit light to obtain broad band or white luminescence. The light emitted from the organic EL element is light wherein various wavelengths are mixed.

However, there is not known any organic EL element which has a multi-layered, laminated structure, emits light with a high color purity and a narrow band (narrow spectrum), and has a long durability.

In light of the above-mentioned problems, an object of the present invention is to provide an organic EL element which emits light with a high color purity and a narrow band and has a long durability.

DISCLOSURE OF THE INVENTION

In order to solve the problems, the present inventors have found out that in an organic EL element having at least two emitting layers, the light emission of the second emitting layer is restrained or the two emitting layers satisfy a given relationship, whereby the color purity and/or durability of the element can be improved.

The present invention provides the following EL elements.

[1] An organic electroluminescence element comprising:
   an anode;
   a first emitting layer comprising at least a first host material and a first dopant;
   a second emitting layer comprising at least a second host material and a second dopant; and
   a cathode in the order mentioned:
   wherein the energy gap $E_{gh}1$ of the first host material, the energy gap $E_{gd}1$ of the first dopant, the energy gap $E_{gh}2$ of the second host material, and the energy gap $E_{gd}2$ of the second dopant satisfy the following formulas; and
   the luminescent intensity I1 at the maximum luminescent wavelength of an emission spectrum derived from the first emitting layer, and the luminescent intensity I2 at the maximum luminescent wavelength of an emission spectrum derived from the second emitting layer satisfy the following formula:

$E_{gh}1 > E_{gd}1$ $E_{gh}2 > E_{gd}2$ $E_{gd}1 > E_{gd}2$ $I1 > 3.5 \times I2$.

[2] An organic electroluminescence element according to [1], wherein the following formula is satisfied:

$I1 > 5 \times I2$.

[3] An organic electroluminescence element according to [1] or [2], wherein $E_{gd}2$ is more than 2.7 eV.

[4] An organic electroluminescence element comprising:
   an anode;
   a first emitting layer comprising at least a first host material and a first dopant;
   a second emitting layer comprising at least a second host material and a second dopant; and
   a cathode in the order mentioned:
   wherein the energy gap $E_{gh}1$ of the first host material, the energy gap $E_{gd}1$ of the first dopant, the energy gap $E_{gh}2$ of the second host material, and the energy gap $E_{gd}2$ of the second dopant satisfy the following formulas:

$E_{gh}1 > E_{gd}1$ $E_{gh}2 > E_{gd}2$ $E_{gd}1 > E_{gd}2 > 2.7$ eV.

[5] An organic electroluminescence element according to any one of [1] to [4], wherein the ratio of the first dopant to the first host material is 0.1 to 10 mol % in the first emitting layer.

[6] An organic electroluminescence element according to any one of [1] to [5], wherein the ratio of the second dopant to the second host material is 0.1 to 10 mol % in the second emitting layer.

[7] An organic electroluminescence element according to any one of [1] to [6], wherein at least one of the first host material and the second host material is a compound represented by a formula [1]:

wherein $Ar^1$ is an aromatic ring with 6 to 50 nucleus carbons, X is a substituent, m is an integer of 1 to 5 and n is an integer of 0 to 6, provided that Ars may be the same as or different from each other when m is 2 or more, and Xs may be the same as or different from each other when n is 2 or more.

[8] An organic electroluminescence element according to any one of [1] to [7], wherein the first host material is the same as the second host material.

[9] An organic electroluminescence element according to any one of [1] to [8], wherein at least one of the first dopant and the second dopant is a compound represented by a formula [2]:

wherein $Ar^2$ to $Ar^4$ are a substituted or unsubstituted aromatic group with 6 to 50 nucleus carbons, or a substituted or unsubstituted stylyl group; and p is an integer of 1 to 4; provided that $Ar^3$s and $Ar^4$s may be the same as or different from each other when p is 2 or more.

[10] An organic electroluminescence element according to any one of [1] to [9], wherein the first emitting layer has a film thickness of 10 nm or more.

[11] An organic electroluminescence element according to any one of [1] to [10], wherein the luminescent intensity I2 at the maximum luminescent wavelength of an emission spectrum derived from the second emitting layer is 0.

[12] An organic electroluminescence element according to any one of [1] to [11], further comprising an electron injecting layer between the second emitting layer and the cathode, the electron mobility of the electron injecting layer being $10^{-4}$ cm$^2$/(V·sec) or more.

[13] An organic electroluminescence element according to [12], wherein the electron injecting layer comprises one or more organic compounds comprising a nitrogen-containing heterocyclic derivative.

[14] An organic electroluminescence element according to [13], wherein the organic compound(s) is/are an imidazopyrazine derivative and/or an imidazole derivative.

BEST MODES FOR CARRYING OUT THE INVENTION

The present invention is described in detail hereinafter.

A first organic EL element of the present invention comprises an anode, a first emitting layer comprising at least a first host material and a first dopant, a second emitting layer comprising at least a second host material and a second dopant, and a cathode in the order mentioned, wherein the energy gap $E_{gh}1$ of the first host material, the energy gap $E_{gd}1$ of the first dopant, the energy gap $E_{gh}2$ of the second host material, and the energy gap $E_{gd}2$ of the second dopant satisfy the following formulas; and the luminescent intensity I1 at the maximum luminescent wavelength of an emission spectrum derived from the first emitting layer, and the luminescent intensity I2 at the maximum luminescent wavelength of an emission spectrum derived from the second emitting layer satisfy the following formulas:

$$E_{gh}1 > E_{gd}1$$

$$E_{gh}2 > E_{gd}2$$

$$E_{gd}1 > E_{gd}2$$

$$I1 > 3.5 \times I2.$$

Figure 1:
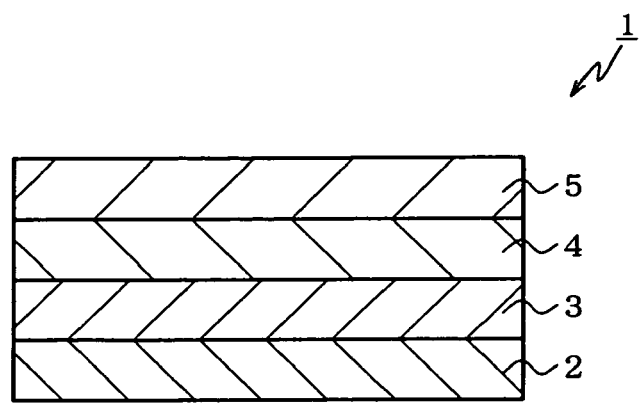
FIG. 1 is a schematic sectional view of an organic EL element of the present invention.

FIG. 1 is a schematic sectional view of an organic EL element of the present invention.

The organic EL element 1 has at least an anode 2, a first emitting layer 3, a second emitting layer 4, and a cathode 5, and these are laminated in the order mentioned.

Figure 2:
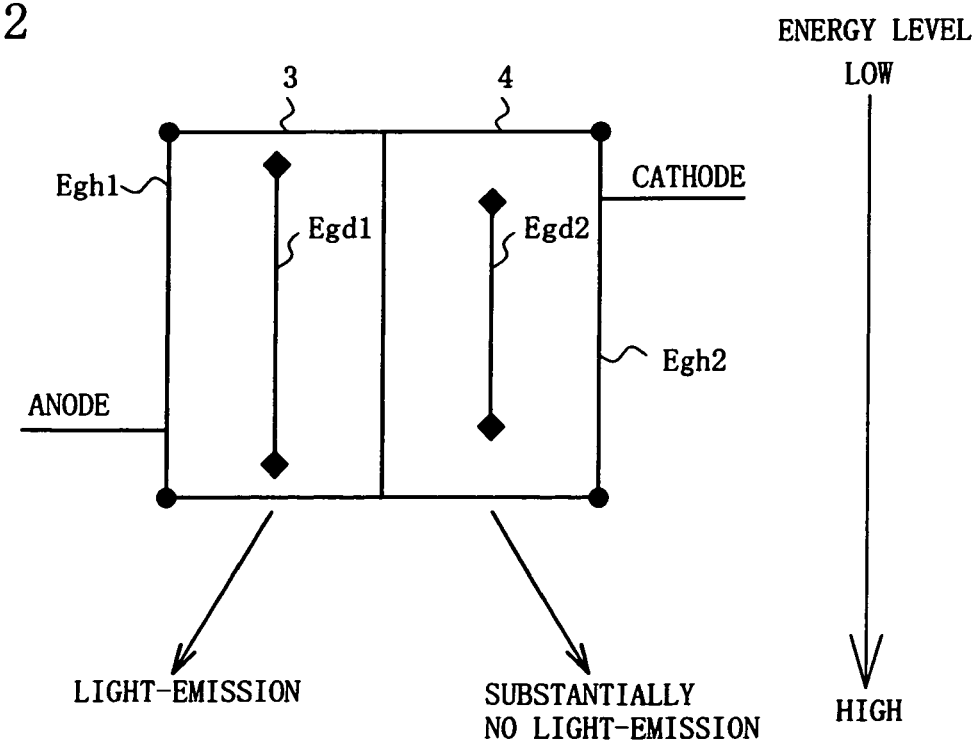
FIG. 2 is the energy diagram of the organic EL element of the present invention.
Figure 3:
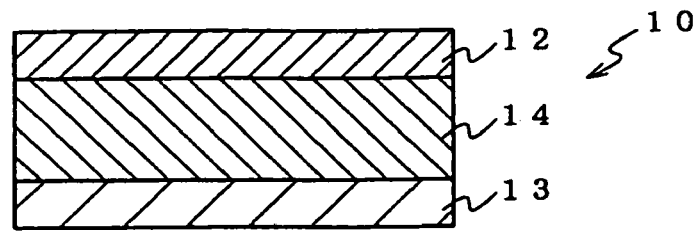
FIG. 3 is a schematic sectional view of an ordinary organic EL element.
Figure 4:
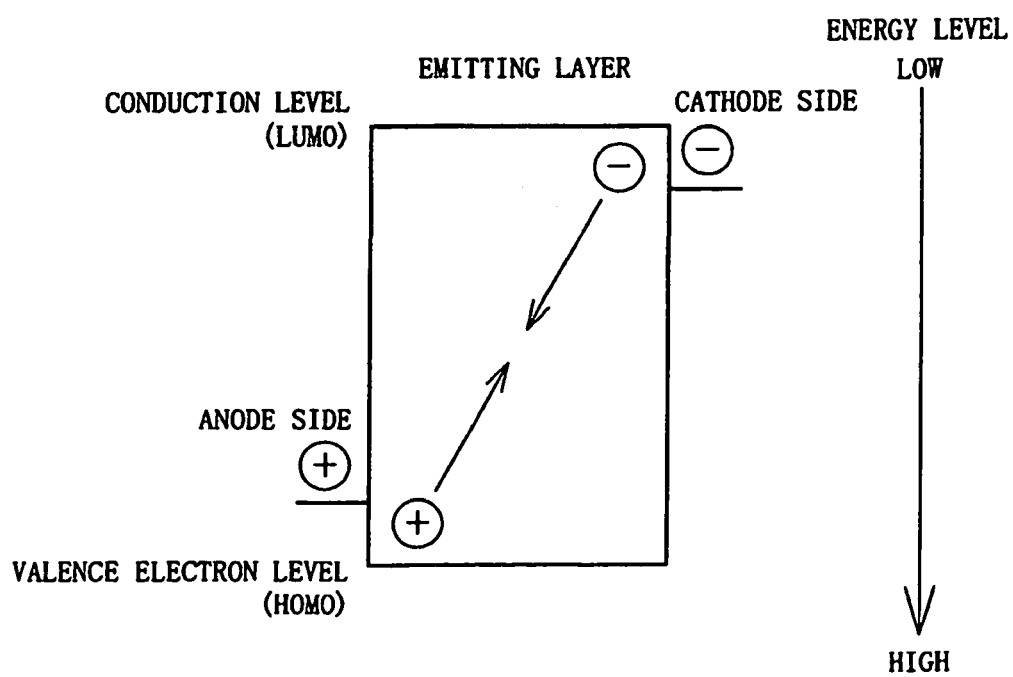
FIG. 4 is the energy diagram of the organic EL element.
Figure 5:
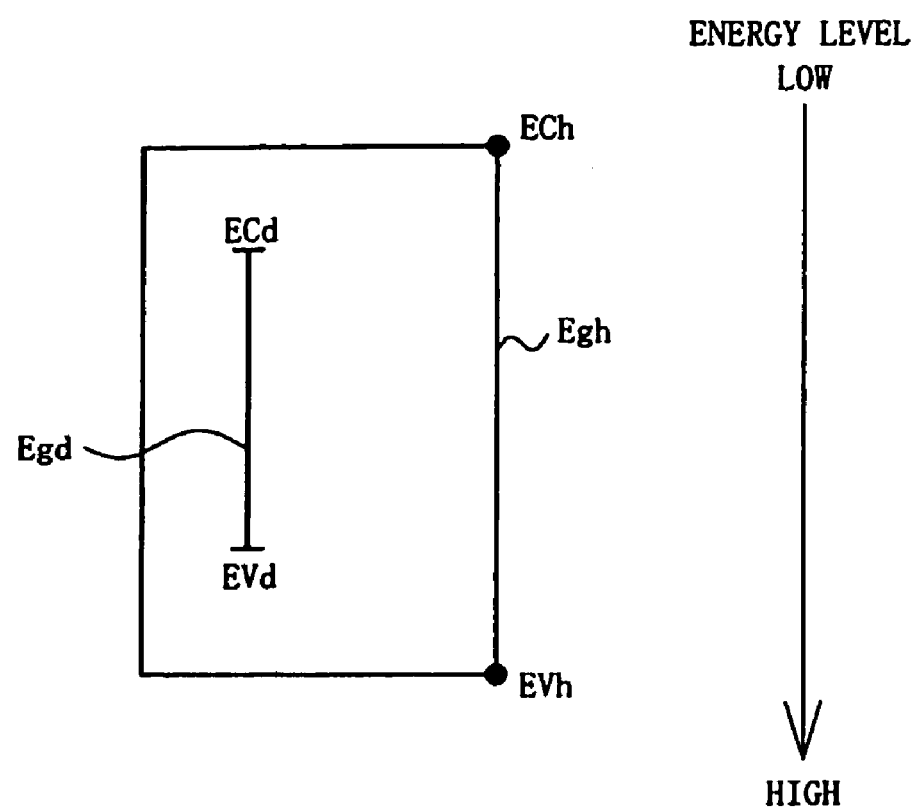
FIG. 5 is the energy diagram of an organic EL element to which a dopant is added.

FIG. 2 is the energy diagram of the organic EL element 1.

In this energy diagram, energy levels of the anode 2, the first emitting layer 3, the second emitting layer 4, and the cathode 5 are shown. The following are also shown: the energy gap $E_{gh}1$ of the first host material, the energy gap $E_{gd}1$ of the first dopant, the energy gap $E_{gh}2$ of the second host material, and the energy gap $E_{gd}2$ of the second dopant.

The energy gap corresponds to the energy difference between the valence electron level of an organic EL material and the conduction level thereof, and is usually obtained from an absorption edge of the optical absorption spectrum of the material.

As shown in FIG. 2, in the present invention, an emitting layer is made into a bi-layered structure and the different emitting layers 3 and 4 are doped with the first dopant and the second dopant, respectively, the first emitting layer 3 containing the dopant with a large energy gap mainly emitting light.

In general, when two kinds of dopants are incorporated into a single emitting layer, energy shift is easily caused since the distance between these dopants is small. Usually, therefore, each of the two kinds of dopants emits light or only the dopant having a smaller energy gap emits light. It is very difficult to cause only the dopant having a larger energy gap to emit light.

However, as understood from the conventional art, only by making an emitting layer into a bi-layered structure, both of the first emitting layer 3 and the second emitting layer 4 emit light. Therefore light with a narrow band leading to a high purity of color is not obtained.

One of the causes thereof is position where holes and electrons are recombined. Holes injected into the emitting layer are recombined with electrons, whereby the concentration thereof becomes lower as the holes advance further toward the cathode 5. However, a part thereof reach the vicinity of the cathode 5. Accordingly, a recombining region is present near the cathode 5 also. This causes light emission of both of the first emitting layer 3 (emitting layer near the anode 2) and the second emitting layer 4 (emitting layer near the cathode 5).

Thus, in order to restrain light emission of the emitting layer containing a dopant having a small energy gap, the emission being a cause of lowering the purity of color, the first emitting layer 3 is formed near the anode 2 where a recombination possibility is high, and the second light emitting 4 is formed near the cathode 5 where a recombination possibility is low. This makes it possible that light is emitted mainly by the first emitting layer 3 and that light emission of the second emitting layer 4 is sufficiently reduced.

Furthermore, in the present invention, an electron injecting layer is formed between the second emitting layer 4 and the cathode 5. The electron mobility of this electron injecting layer is preferably $10^{-4}$ cm$^2$/V·second or more in an electric field having an electric field intensity (E) of $1 \times 10^5$ to $10^6$ V/cm.

The electron injecting layer having such an electron mobility enables the more stable formation of a light emitting region in the first emitting layer 3. Accordingly, the first emitting layer 3 can emit light more selectively, so that narrow band luminescence better in color purity can be obtained. Additionally, the durability of the EL element can be made remarkably long.

As a method for measuring the electron mobility, the following is known: the time of flight method (the method of calculating the mobility from the measurement of the running time of charges in an organic film), a method of calculating the mobility from the voltage characteristic of space limitation electric current, or the like [see Electronic Process in Organic Crystals (M. Pope, C. E. Swenberg), and Organic Molecular Solids (W. Jones)].

In the specification, it is calculated by the time of flight method. Specifically, for a laminate of ITO/an organic layer (such as an electron injecting layer)/Al, the time characteristic (the transient characteristic time) of the transient current generated by radiation of light is measured and then the electron mobility is calculated from the following equation:

Electron mobility=(Organic layer thickness)$^2$/(Transient characteristic time×Electric field intensity)

In general, the number of materials having a large energy gap and having a long half life is smaller than that of materials having a small energy gap and having a long half life. Thus, the selection of a material therefrom is difficult. However, this structure allows the longer durability of the organic EL element although the second emitting layer hardly contributes to light emission.

In this organic EL element 1, the energy gap ($E_{gh}1$) of the first host material is larger than the energy gap ($E_{gd}1$) of the first dopant. That is, the relationship of $E_{gh}1 > E_{gd}1$ is satisfied.

The energy gap $E_{gd}1$ of the first dopant is preferably more than 2.7 eV. In general, the number of dopants having a large energy gap and giving a short durability to organic EL elements is larger than that of dopants having a small energy gap and giving a short durability to organic EL elements. Therefore, for purely blue organic EL elements used for full color display, it is difficult that the durability thereof is made long. In the present invention, however, purely blue luminescence having a very long durability can be obtained by the above-mentioned structure.

The second emitting layer comprises at least a second host material and a second dopant.

The energy gap $E_{gh}2$ of the second host material is larger than the energy gap $E_{gd}2$ of the second dopant. That is, the relationship of $E_{gh}2 > E_{gd}2$ is satisfied.

The energy gap $E_{gd}1$ of the first dopant is larger than the energy gap $E_{gd}2$ of the second dopant, that is, the relationship of $E_{gd}1 > E_{gd}2$ is satisfied.

It is also preferred that the energy gap $E_{gd}2$ of the second dopant is larger than 2.7 eV, that is, the relationship of $E_{gd}2 > 2.7$ eV is satisfied. This enables the production of an organic EL element which emits blue light high in color purity for full color display.

In this organic EL element, the luminescent intensity I1 at the maximum luminescent wavelength of an emission spectrum derived from the first emitting layer and the luminescent intensity I2 at the maximum luminescent wavelength of an emission spectrum derived from the second emitting layer satisfy the relationship of $I1 > 3.5 \times I2$. When this relationship is satisfied, narrow band luminescence good in color purity can be obtained. Preferably, $I1 > 5 \times I2$. More preferably, $I1 > 10 \times I2$. It is in particular preferred that the luminescent intensity I2 from the second emitting layer is 0.

As described above, the durability of an organic EL element can be made long even when the luminescence of its second emitting layer hardly contributes to the luminescence of the whole of the organic EL element.

In general, as materials have a smaller energy gap, a larger number of the materials have a long durability. Thus, the selection of a material therefrom is easy. Accordingly, about EL elements for broad band luminescence or white luminescence, it is relatively easy to make a long-durability element structure.

However, it is difficult to select a long-durability material for narrow band luminescence, in particular, blue luminescence. In particular, purely blue luminescent materials suitable for full color use have hardly been reported so far. The present invention is a technique for elongating the durability of purely blue luminescent materials which have been hitherto known. In other words, the present invention is a technique of daring to using a material the durability of which is known to be long adjacently to an emitting layer and further restricting luminescence therefrom as much as possible, thereby making the durability of the EL element long.

A second organic EL element of the present invention comprises an anode, a first emitting layer comprising at least a first host material and a first dopant, a second emitting layer comprising at least a second host material and a second dopant, and a cathode in the order mentioned, wherein the energy gap $E_{gh}1$ of the first host material, the energy gap $E_{gd}1$ of the first dopant, the energy gap $E_{gh}2$ of the second host material, and the energy gap $E_{gd}2$ of the second dopant satisfy the following formulas:

$E_{gh}1 > E_{gd}1$, $E_{gh}2 > E_{gd}2$, and $E_{gd}1 > E_{gd}2 > 2.7$ eV.

Accordingly, the basic structure thereof is the same as that of the organic EL element described above.

This organic EL element satisfies the relationship of: $E_{gd}1 > E_{gd}2 > 2.7$ eV. This relationship is satisfied; therefore, even if both of the first and second emitting layers emit light, both of them emit blue light, which is different from the above-mentioned organic EL element. Consequently, blue luminescence high in color purity can be obtained.

Furthermore, such an element structure makes it possible to make the durability of the organic EL element long in the same manner as in the first invention.

The host materials used in the first and second emitting layers may each be a material known as a luminescent material having a long durability. It is preferred to use, as the host material of the luminescent material, a material represented by a general formula [1]:

$$(Ar^1)_m\text{—}(X)_n \quad [1]$$

wherein $Ar^1$ is an aromatic ring with 6 to 50 nucleus carbons, X is a substituent, m is integer of 1 to 5, and n is an integer of 0 to 6, provided that $Ar^1$s may be the same as or different from each other when m is 2 or more, and Xs may be the same as or different from each other when n is 2 or more.

Specific examples of $Ar^1$ include phenyl, naphthyl, anthracene, biphenylene, azulene, acenaphthylene, fluorene, phenanthrene, fluoranthene, acephenanthrylene, triphenylene, pyrene, chrysene, naphthacene, picene, perylene, penthaphene, pentacene, tetraphenylene, hexaphene, hexacene, rubicene, coronene, and trinaphthylene rings.

Preferred examples thereof include phenyl, naphthyl, anthracene, acenaphthylene, fluorene, phenanthrene, fluoranthene, triphenylene, pyrene, chrysene, perylene, and trinaphthylene rings.

More preferred examples thereof include phenyl, naphthyl, anthracene, fluorene, phenanthrene, fluoranthene, pyrene, chrysene, and perylene rings.

Specific examples of X include substituted or unsubstituted aromatic groups with 6 to 50 nucleus carbons, substituted or unsubstituted aromatic heterocyclic groups with 5 to 50 nucleus carbons, substituted or unsubstituted alkyl groups with 1 to 50 carbons, substituted or unsubstituted alkoxy groups with 1 to 50 carbons, substituted or unsubstituted aralkyl groups with 1 to 50 carbons, substituted or unsubstituted aryloxy groups with 5 to 50 nucleus atoms, substituted or unsubstituted arylthio groups with 5 to 50 nucleus atoms, substituted or unsubstituted carboxyl groups with 1 to 50 carbons, substituted or unsubstituted styryl groups, halogen groups, a cyano group, a nitro group, and a hydroxyl group.

Examples of the substituted or unsubstituted aromatic groups with 6 to 50 nucleus carbons include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-fluorenyl, 9,9-dimethyl-2-fluorenyl and 3-fluorantenyl groups.

Preferred examples thereof include phenyl, 1-naphthyl, 2-naphthyl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, o-tolyl, m-tolyl, p-tolyl, p-t-butylphenyl, 2-fluorenyl, 9,9-dimethyl-2-fluorenyl and 3-fluorantenyl groups.

Examples of the substituted or unsubstituted aromatic heterocyclic groups with 5 to 50 nucleus carbons include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

Examples of the substituted or unsubstituted alkyl groups with 1 to 50 carbons include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, cyclopropyl, cyclobutyl, cyclopentyl, cyclohexyl, 4-methylcyclohexyl, 1-adamanthyl, 2-adamanthyl, 1-norbornyl, and 2-norbornyl groups.

The substituted or unsubstituted alkoxy groups with 1 to 50 carbons are groups represented by —OY. Examples of Y include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihyroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl groups.

Examples of the substituted or unsubstituted aralkyl groups with 1 to 50 carbons include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl groups.

The substituted or unsubstituted aryloxy groups with 5 to 50 nucleus atoms are represented by —OY'. Examples of Y' include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

The substituted or unsubstituted arylthio groups with 5 to 50 nucleus atoms are represented by —SY", and examples of Y" include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

The substituted or unsubstituted carboxyl groups with 1 to 50 carbons are represented by —COOZ, and examples of Z include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihyroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl groups.

Examples of the substituted or unsubstituted styryl groups include 2-phenyl-1-vinyl, 2,2-diphenyl-1-vinyl, and 1,2,2-triphenyl-1-vinyl groups.

Examples of the halogen groups include fluorine, chlorine, bromine and iodine.

m is preferably 1 to 2, and n is preferably 0 to 4.

Specific examples of the compound of the general formula [1] are illustrated below.

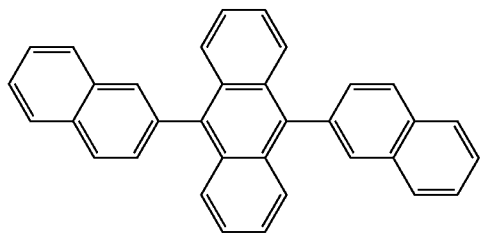

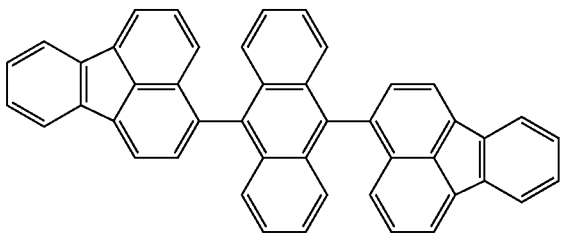

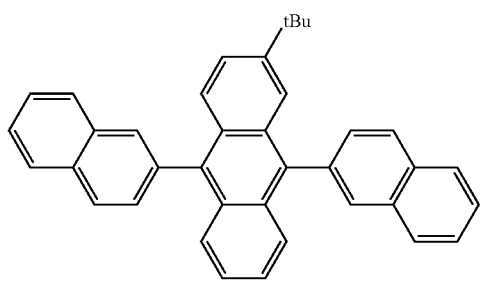

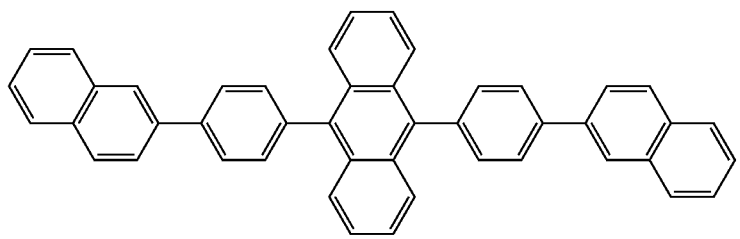

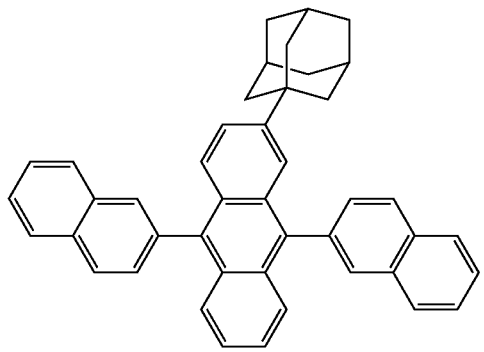

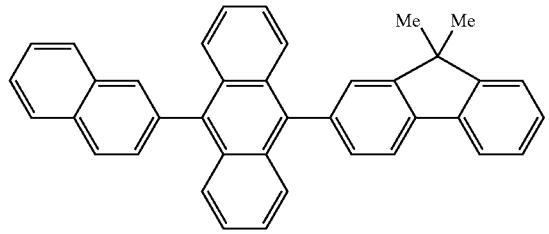

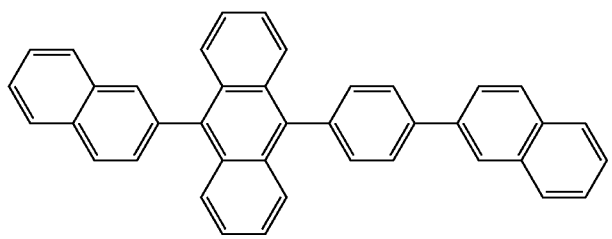

-continued
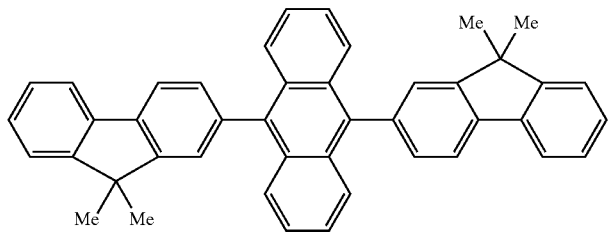
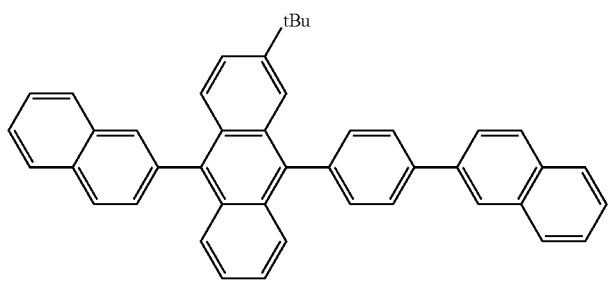
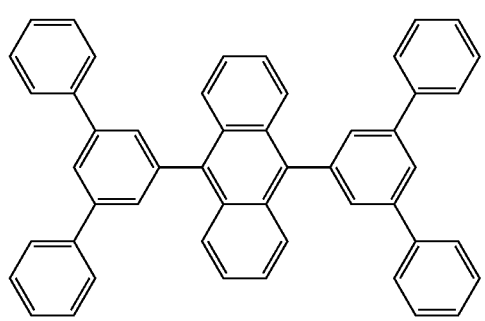
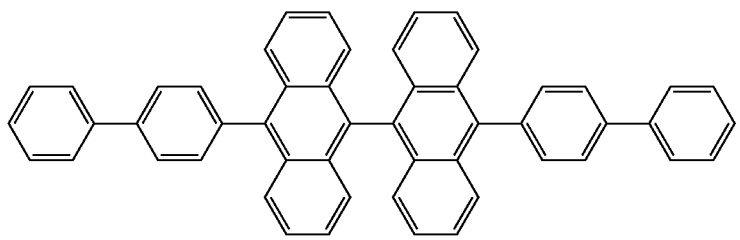
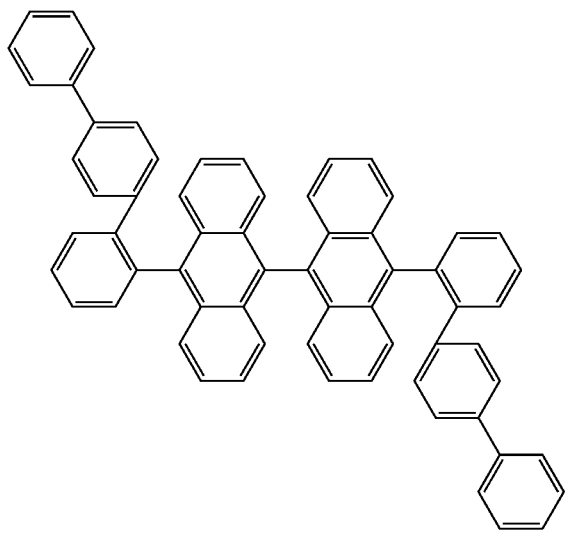

-continued
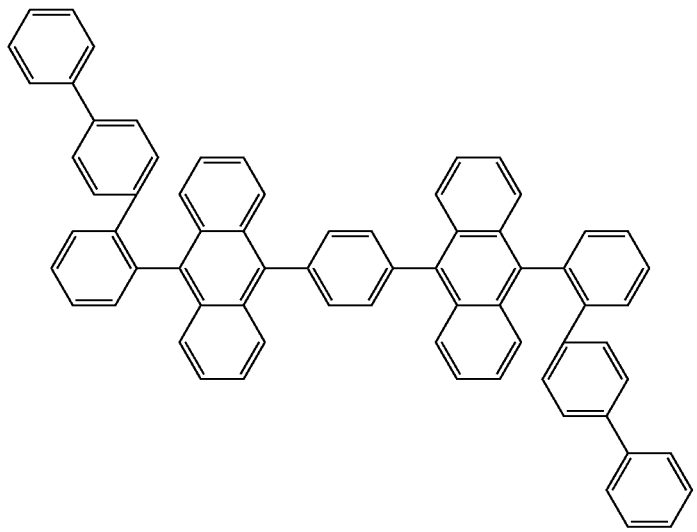
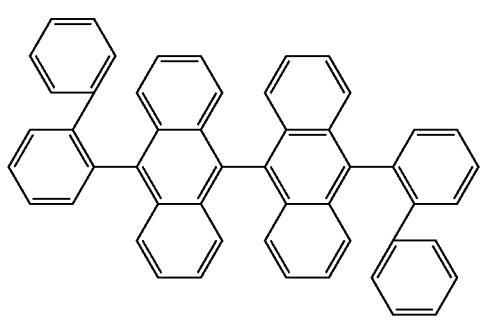
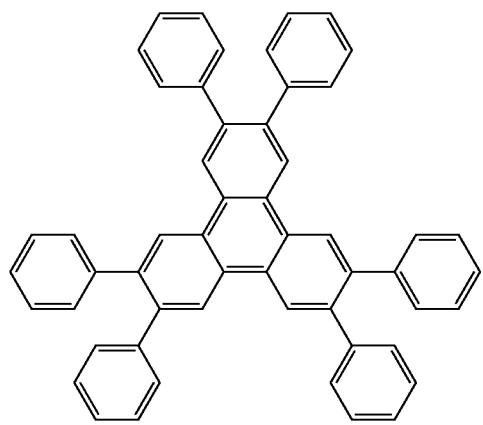
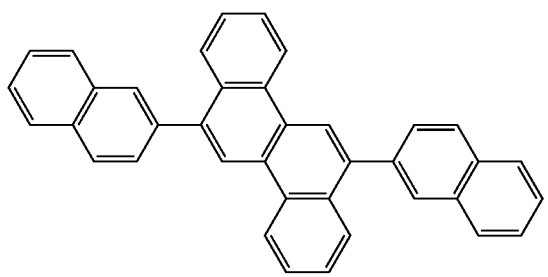
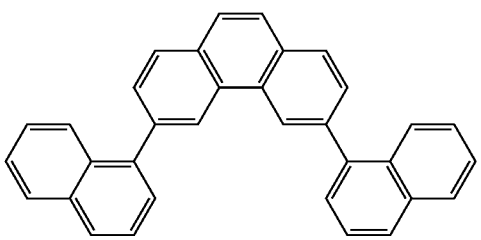
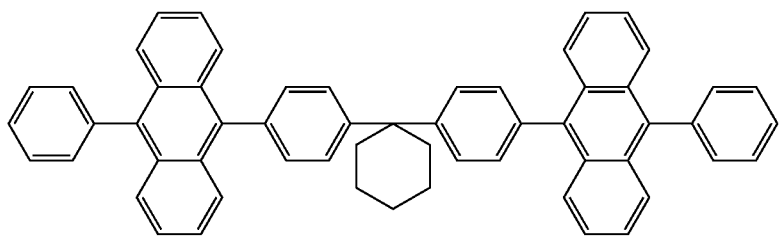

-continued
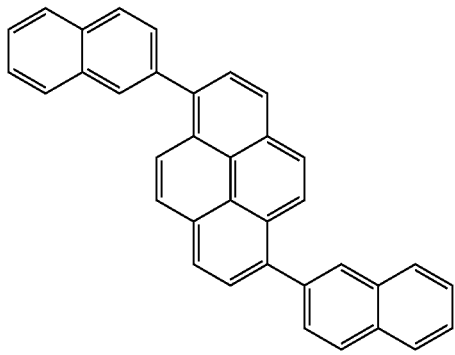
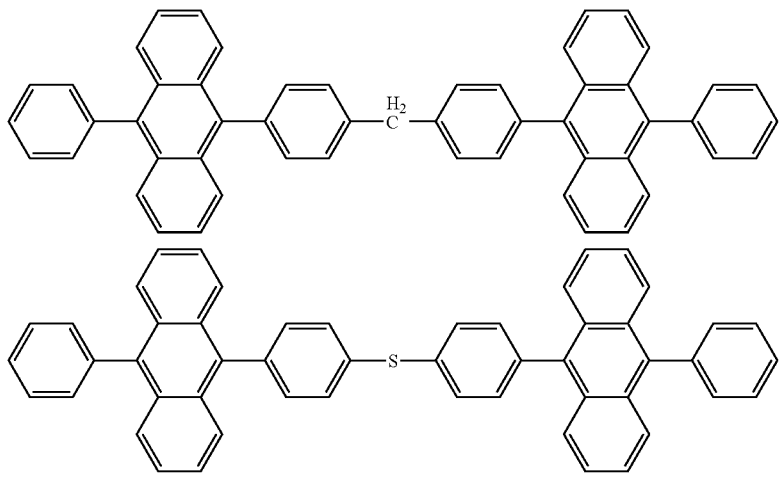
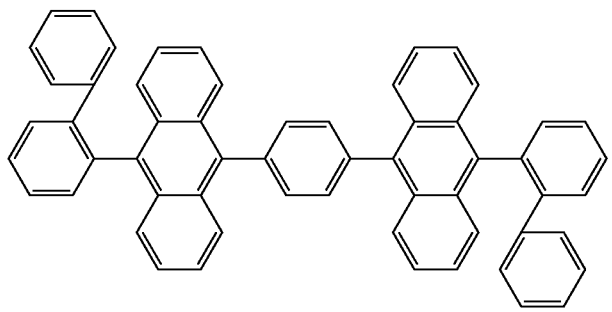
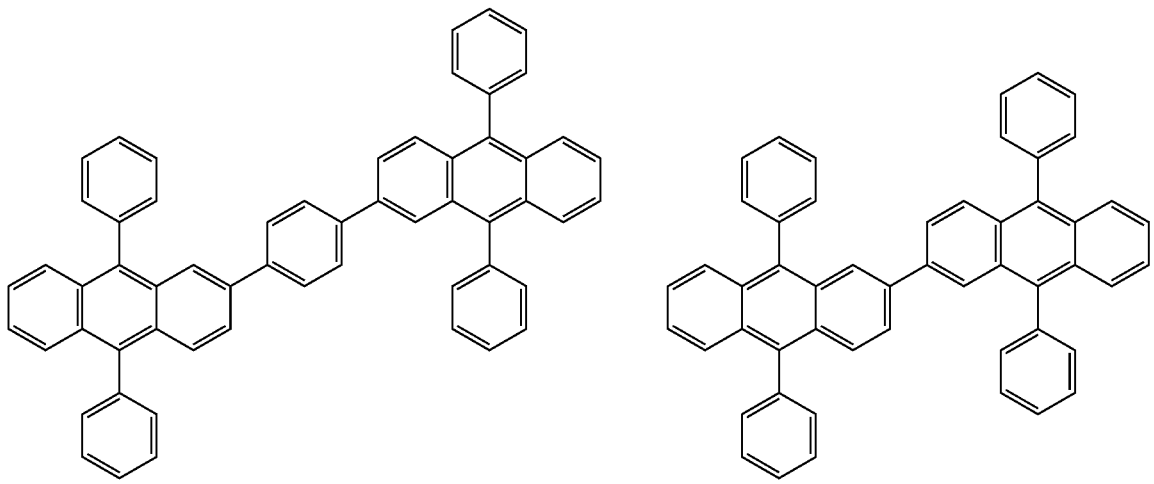

-continued
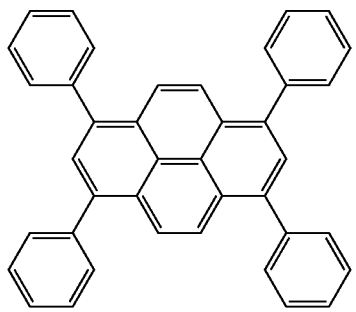
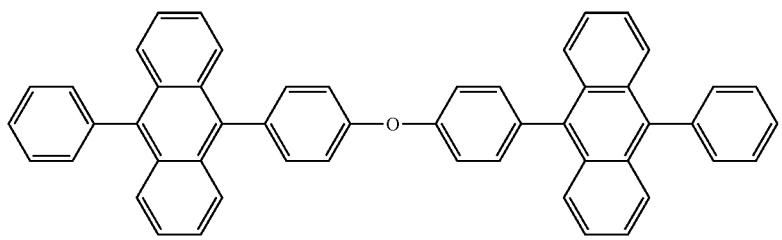
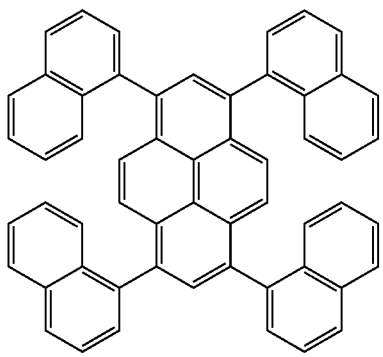
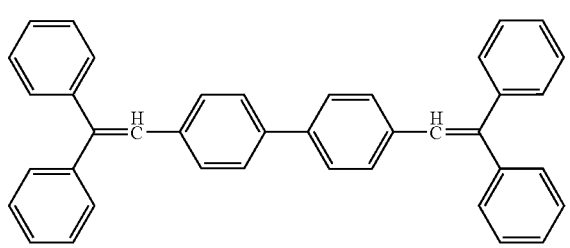
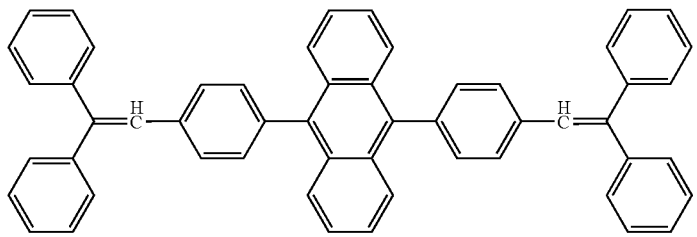
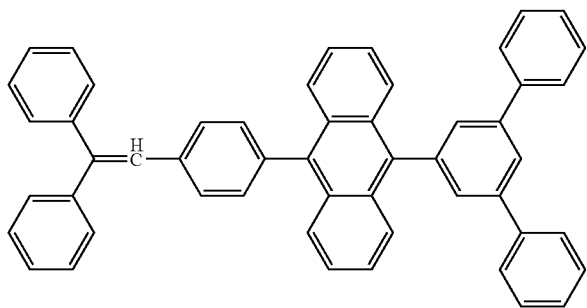

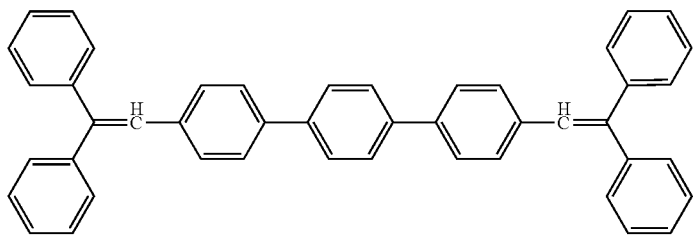

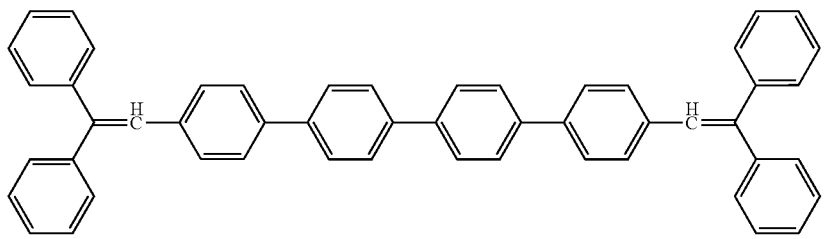

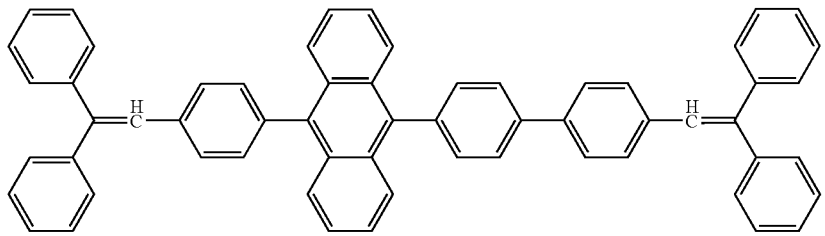

In the organic EL element of the present invention, the first host material and the second host material may be the same as each other in order to make the vapor deposition thereof easy.

The dopants used in the first and second emitting layers may each be a dopant known as a luminescent material having a long durability. It is preferred to use, as the dopant material of the luminescent material, a material represented by a general formula [2]:

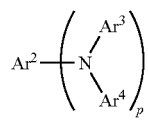

[2]

wherein $Ar^2$ to $Ar^4$ are each a substituted or unsubstituted aromatic group with 6 to 50 nucleus carbons, or a substituted or unsubstituted styryl group; and p is an integer of 1 to 4; provided that $Ar^3$s, as well as $Ar^4$s, may be the same as or different from each other when p is 2 or more.

Examples of the substituted or unsubstituted aromatic group with 6 to 50 nucleus carbons include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-fluorenyl, 9,9-dimethyl-2-fluorenyl and 3-fluorantenyl groups.

Preferred examples thereof include phenyl, 1-naphthyl, 2-naphthyl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, o-tolyl, m-tolyl, p-tolyl, p-t-butylphenyl, 2-fluorenyl, 9,9-dimethyl-2-fluorenyl and 3-fluorantenyl groups.

Examples of the substituted or unsubstituted styryl group include 2-phenyl-1-vinyl, 2,2-diphenyl-1-vinyl, and 1,2,2-triphenyl-1-vinyl groups.

Specific examples of the compound of the general formula [2] and examples of the other preferred compounds as a dopant are illustrated below. In the formulas, Me represents a methyl group, and Et represents an ethyl group.

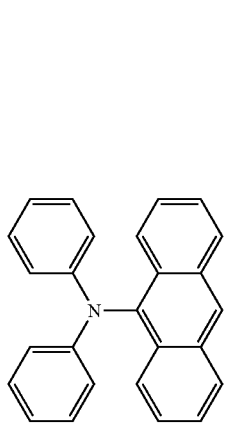 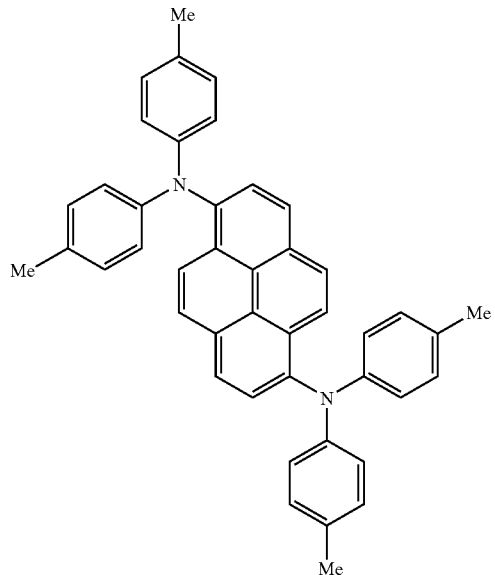 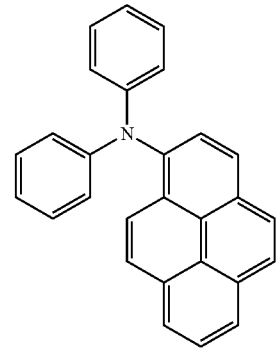
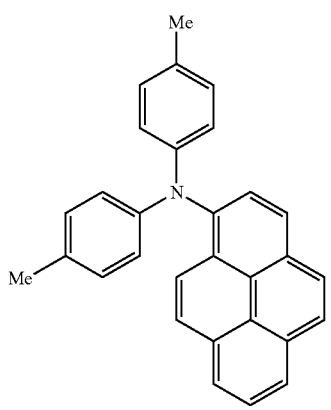 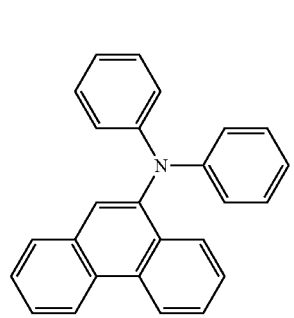 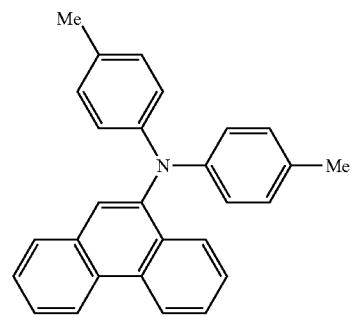
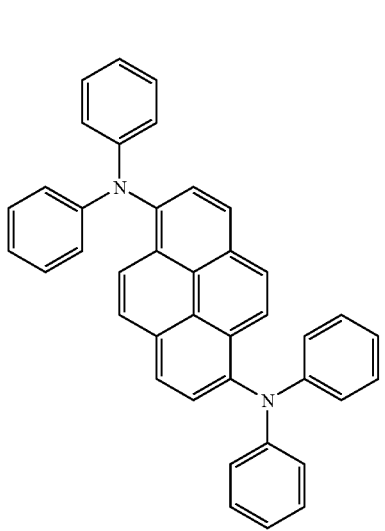 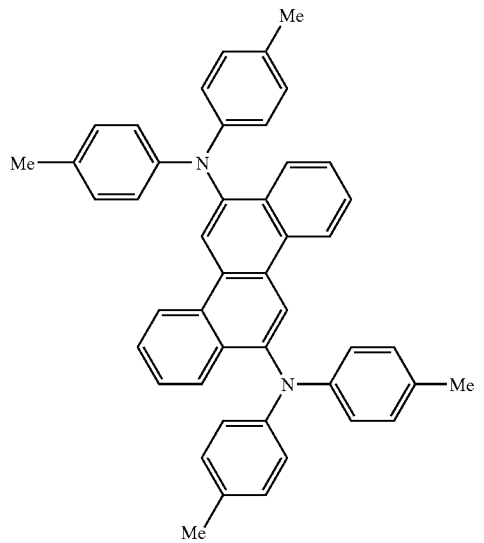

-continued
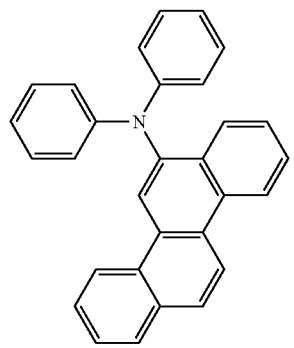
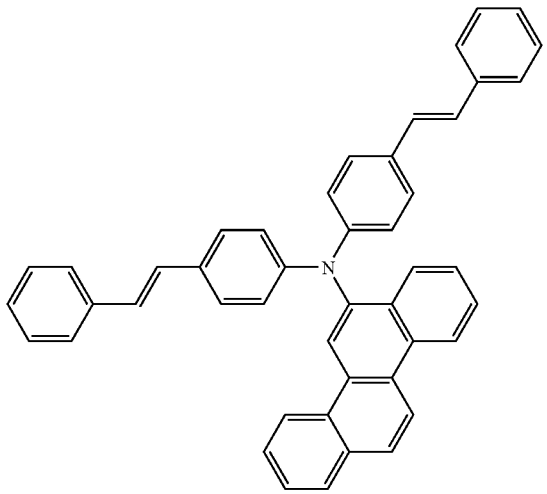
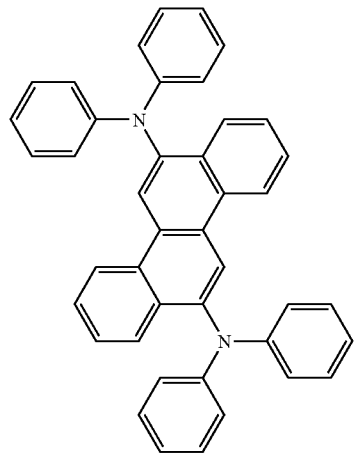
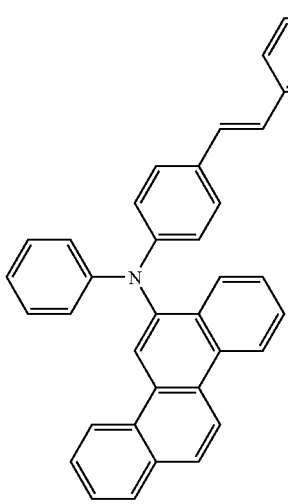
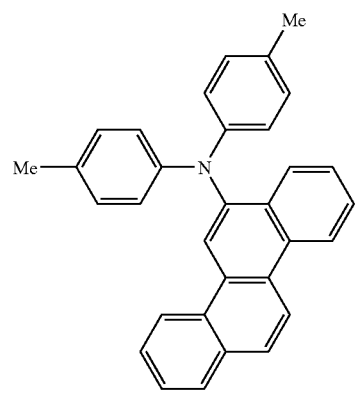
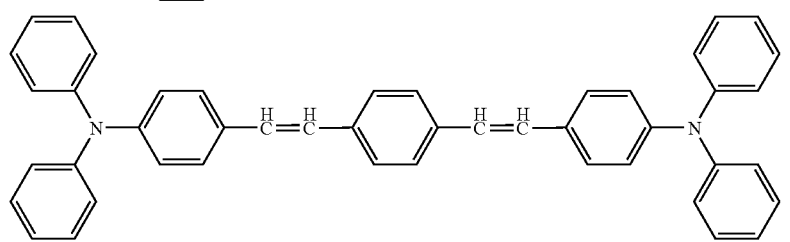
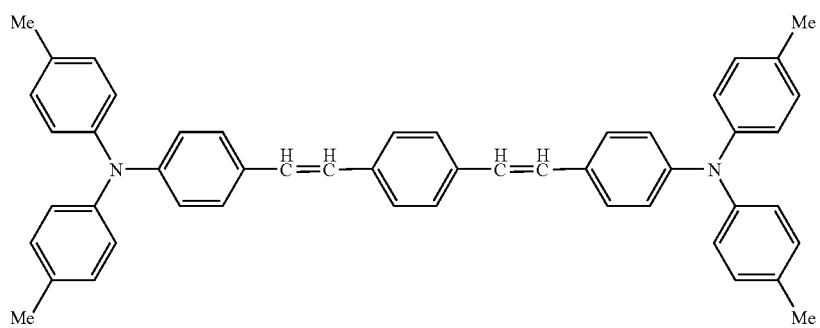

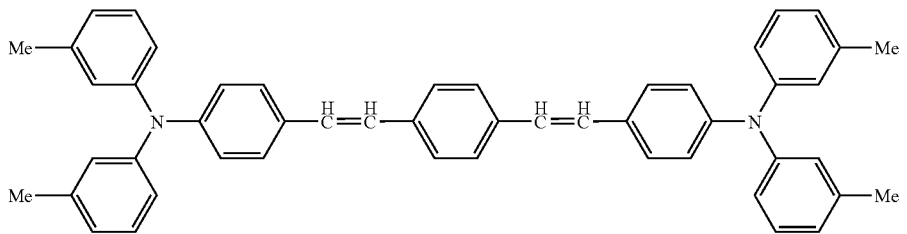
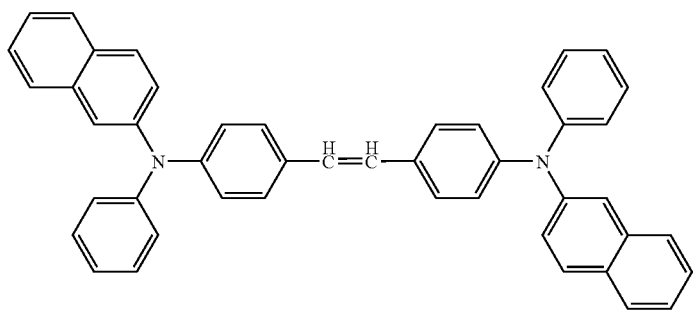
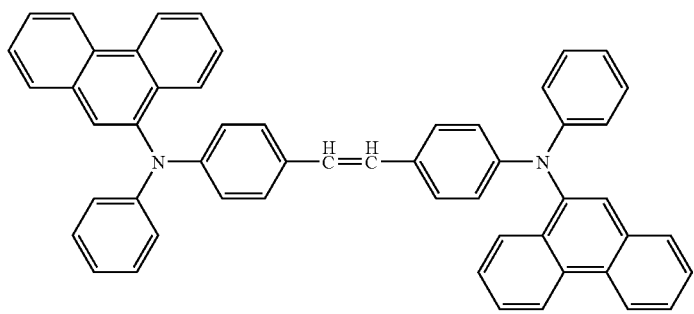
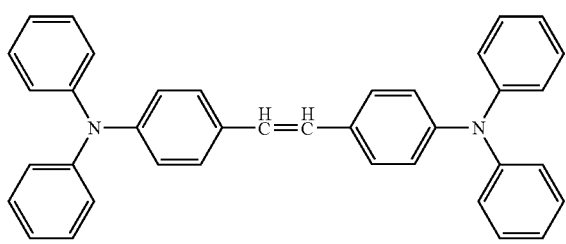
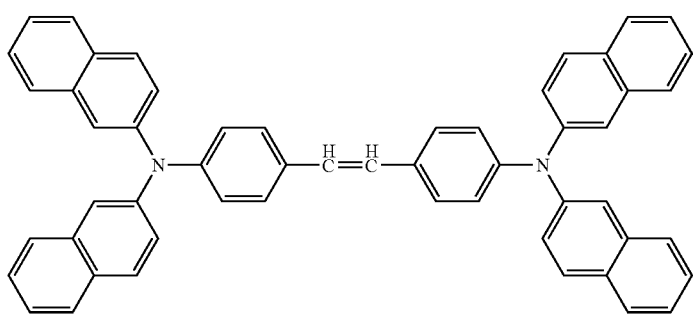

-continued
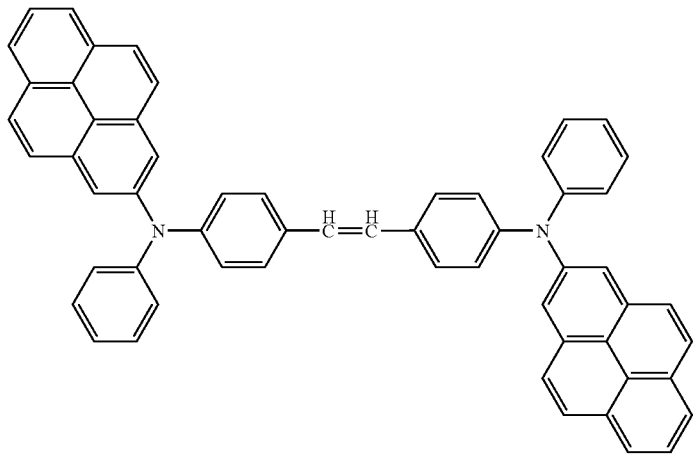
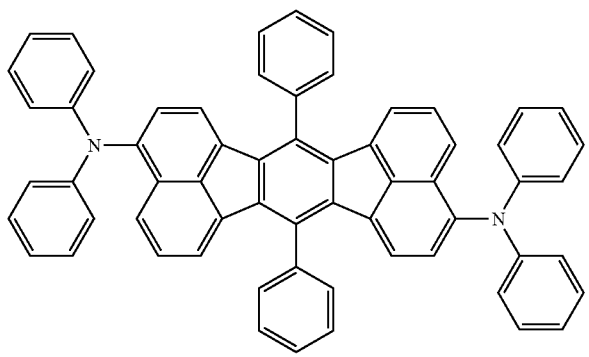
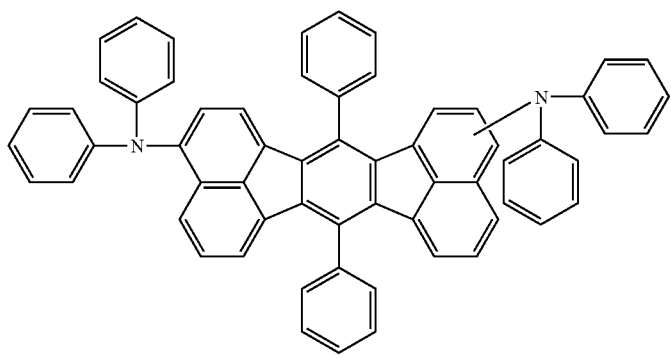
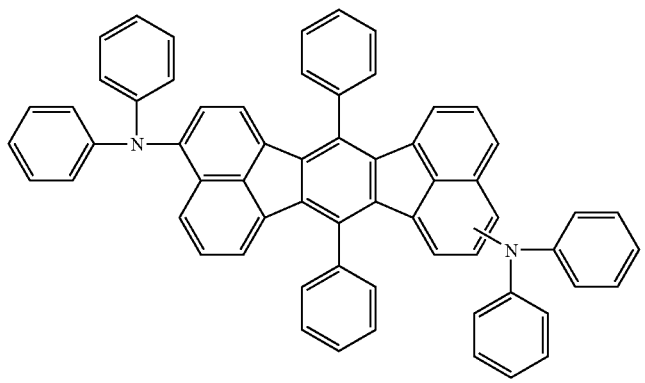

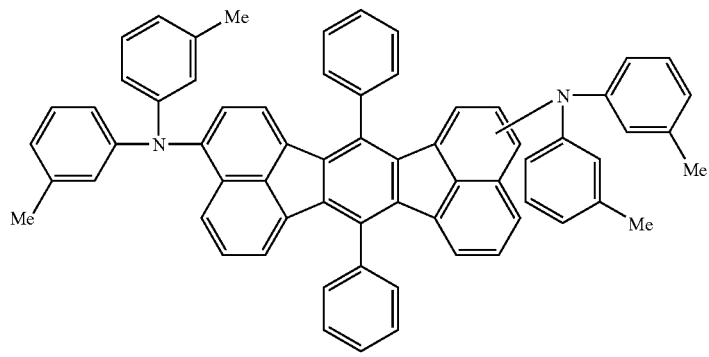
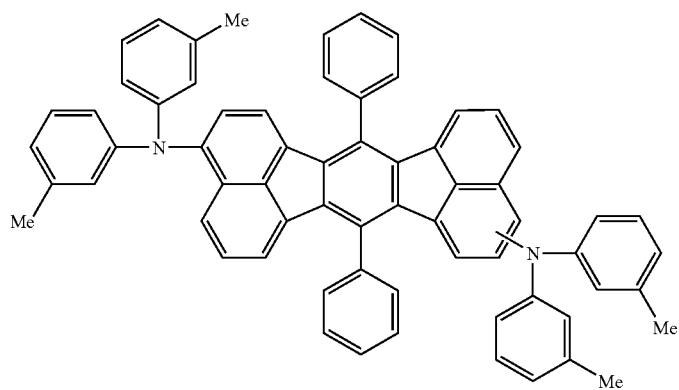
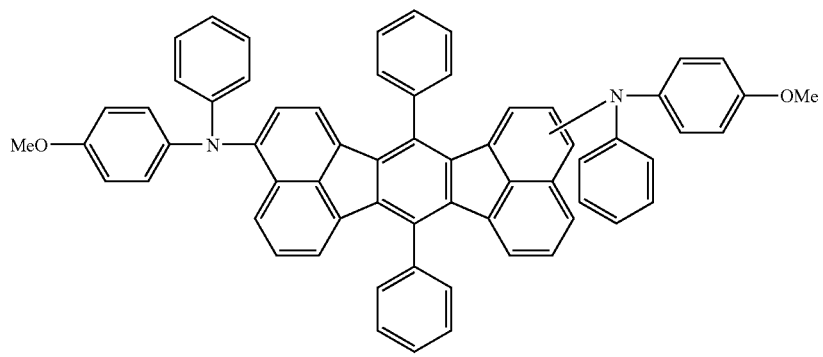
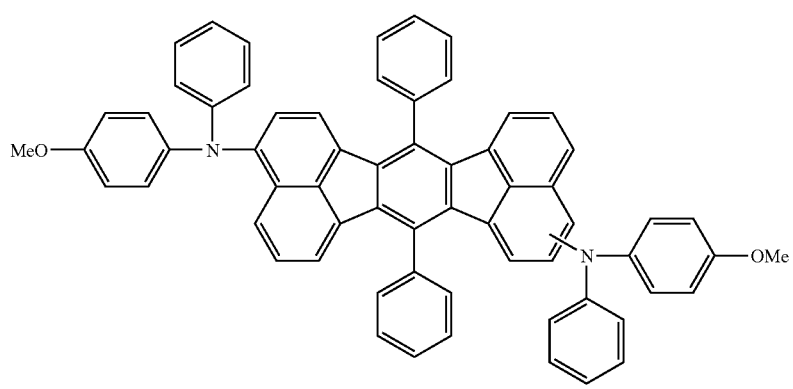

-continued
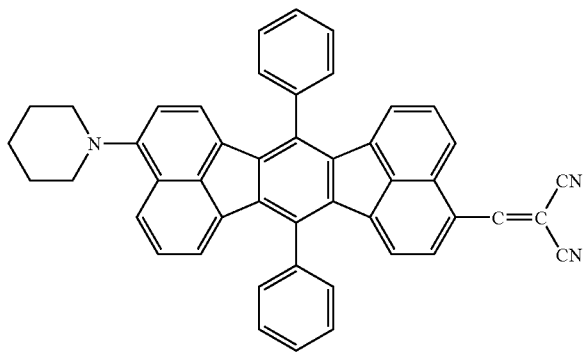
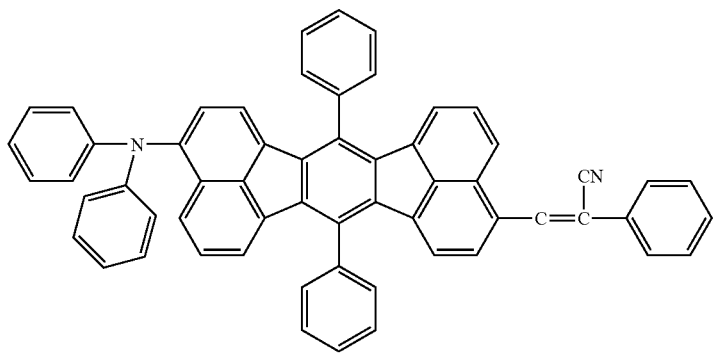
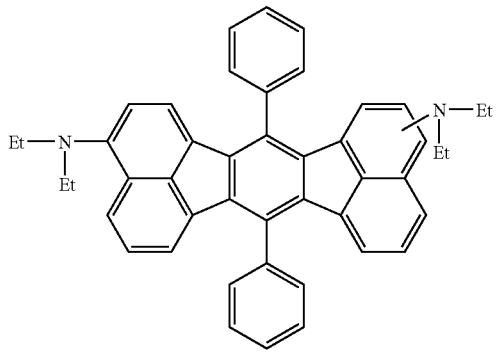
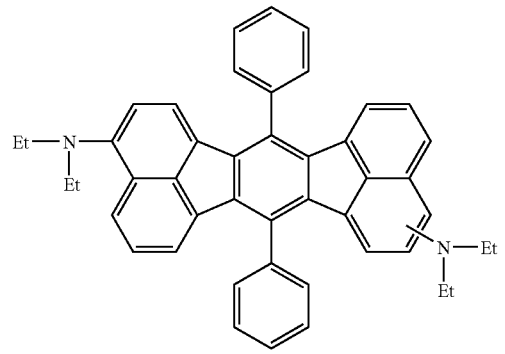
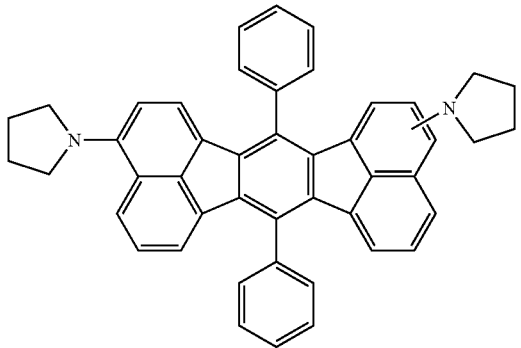
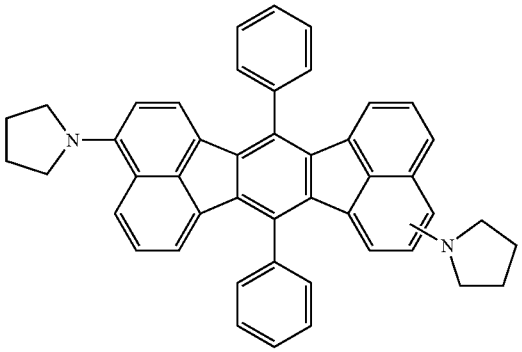

-continued
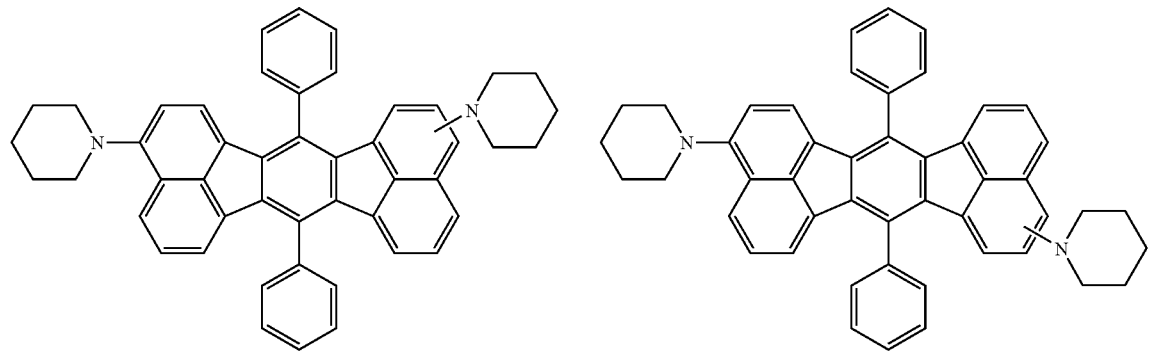
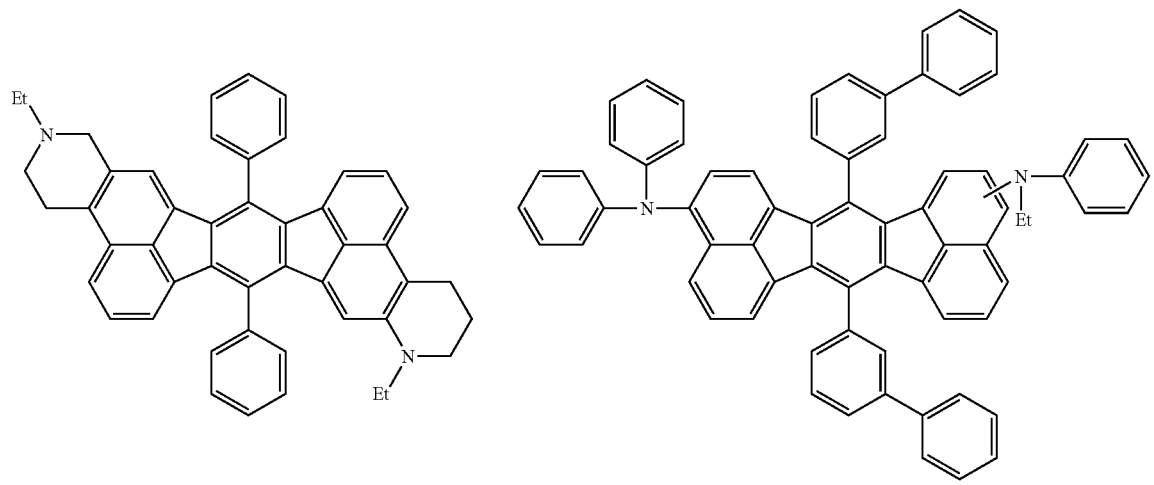
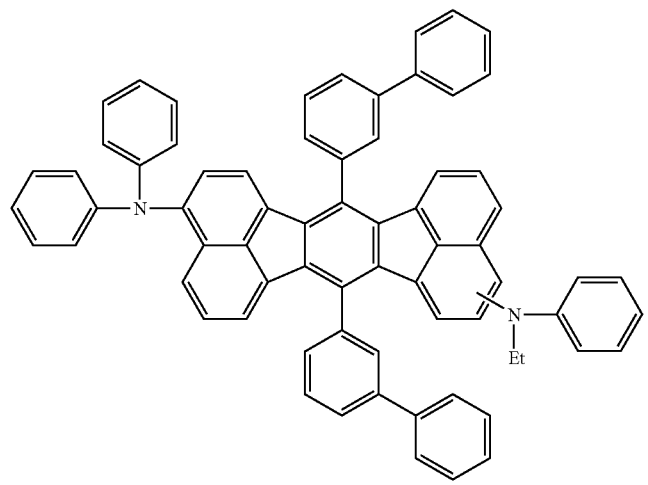

-continued
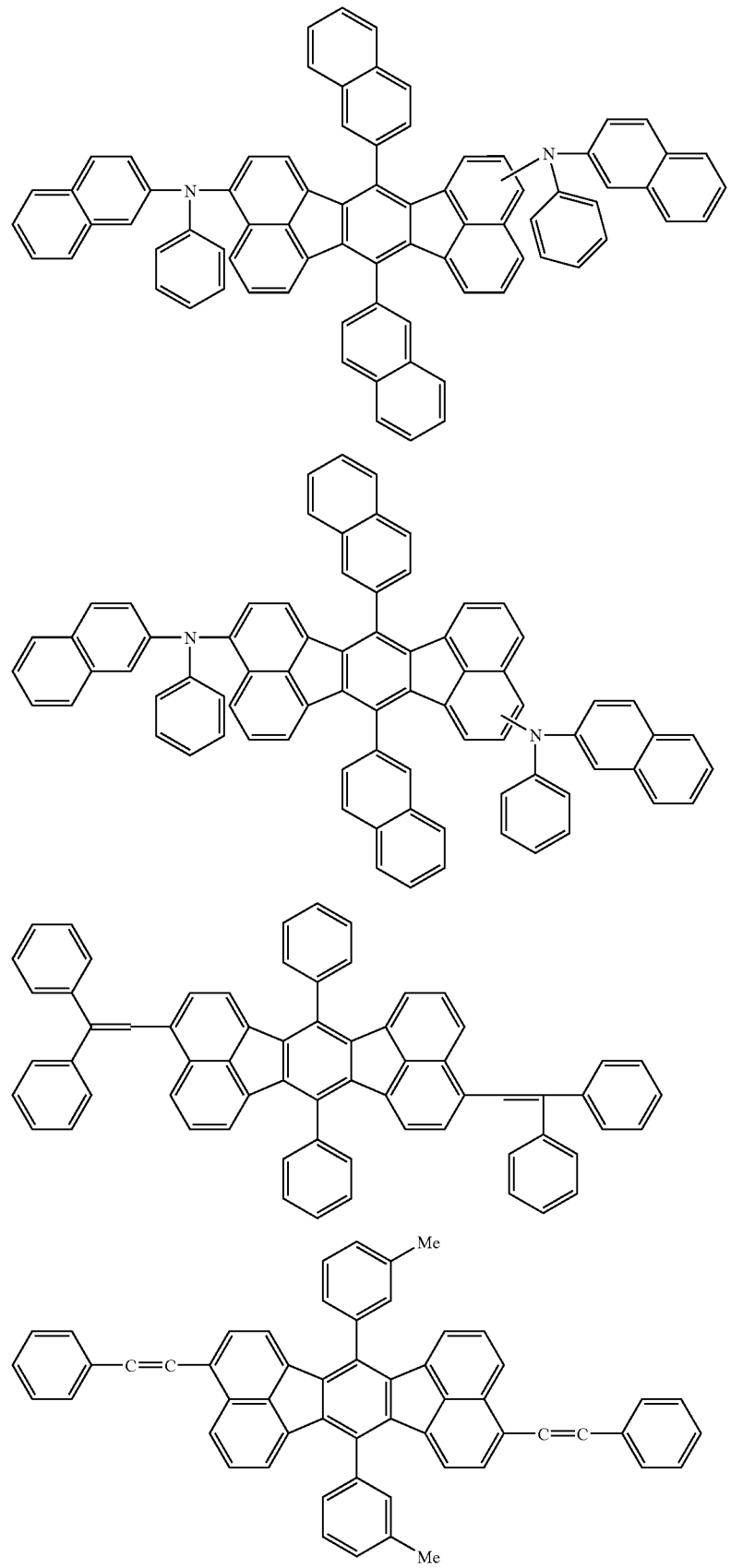

-continued
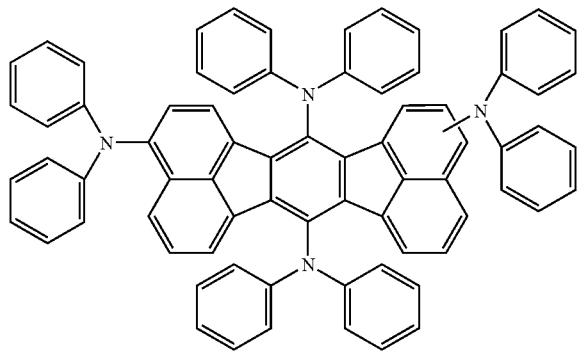
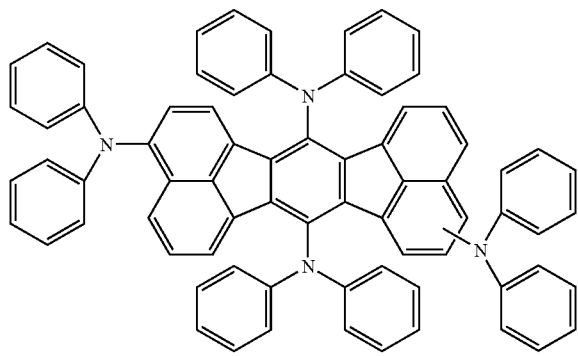
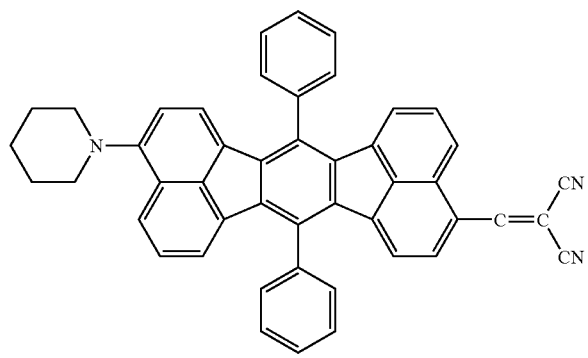
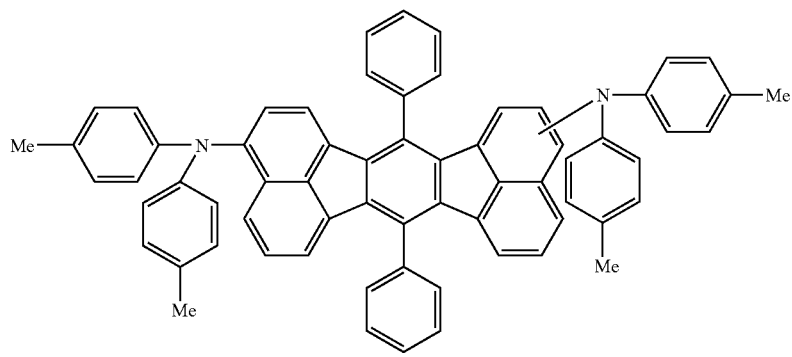

-continued
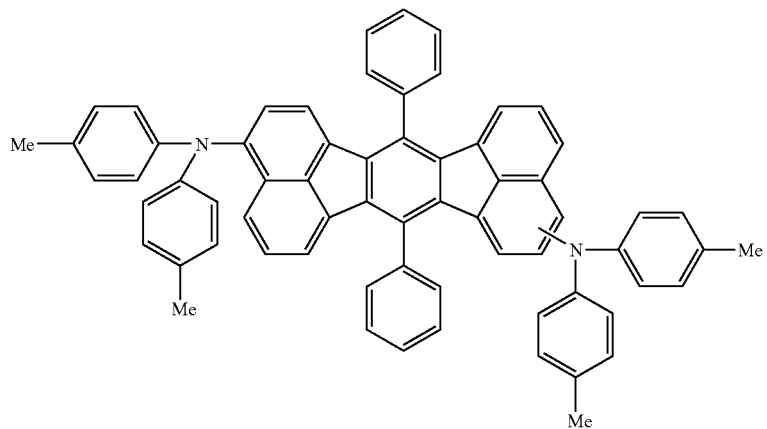
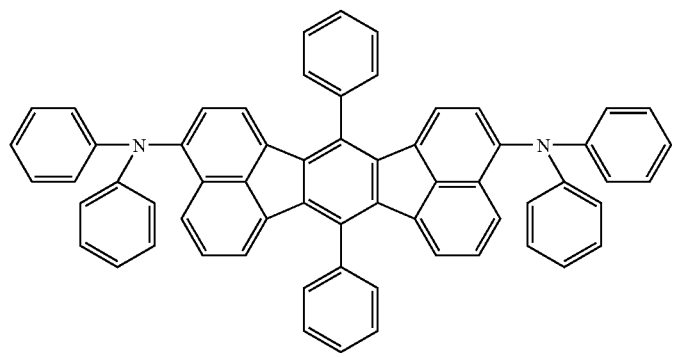
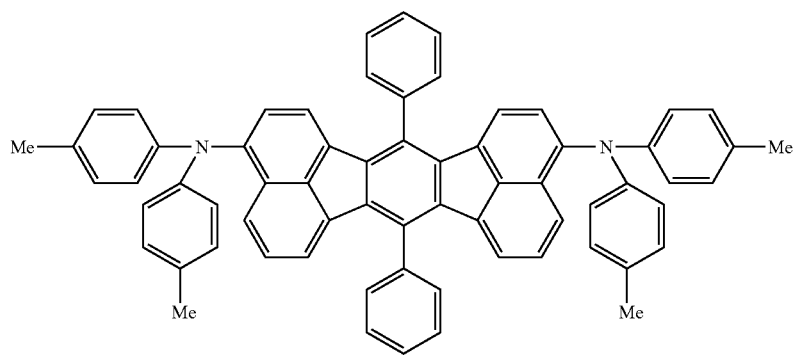
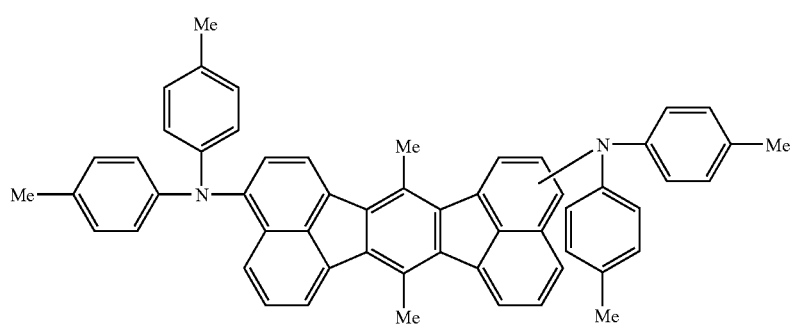

-continued
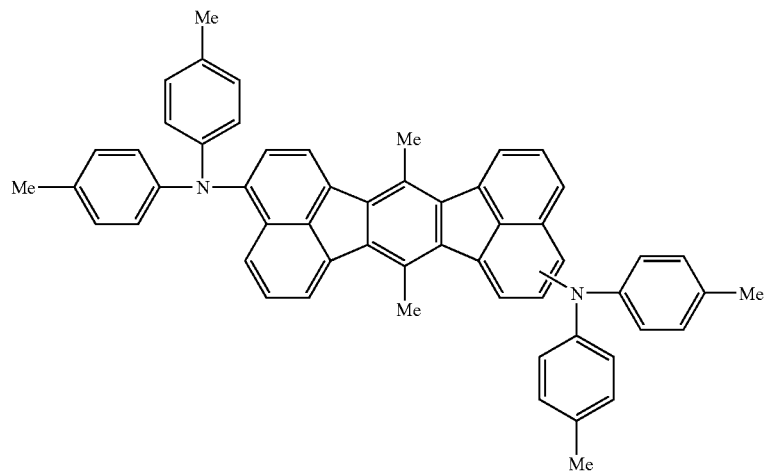
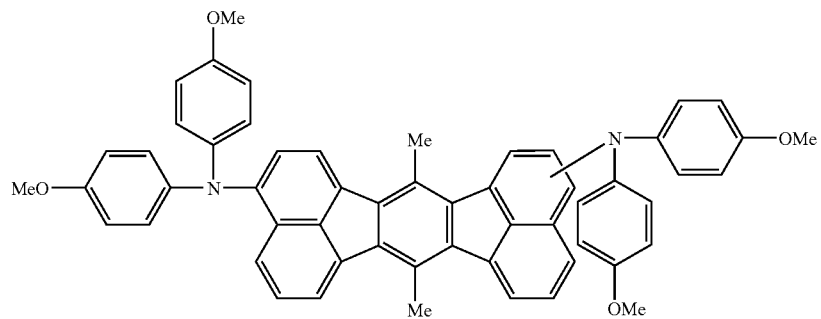
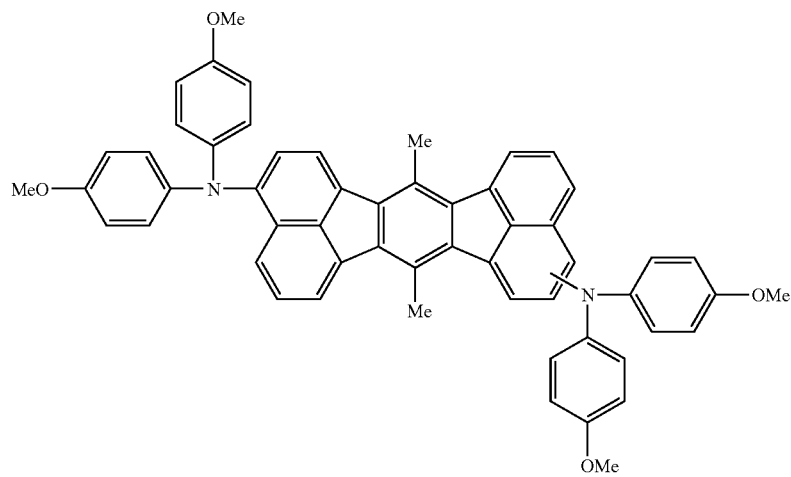
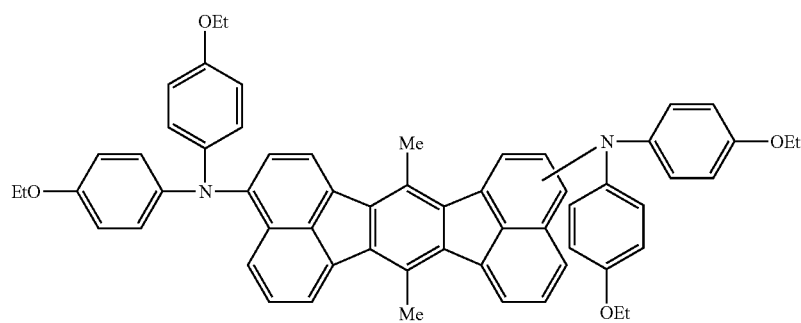

-continued
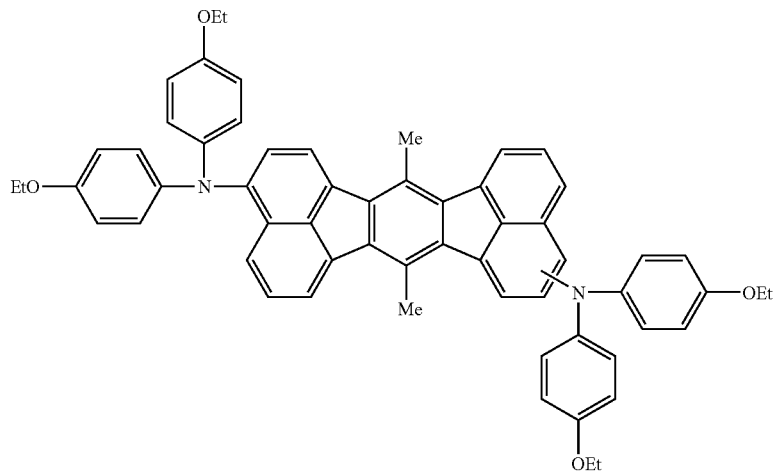
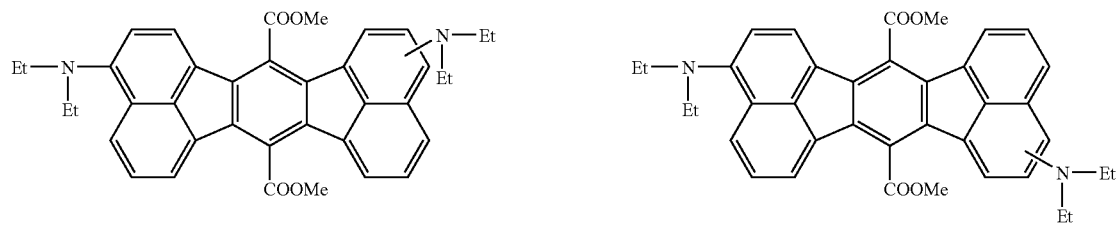
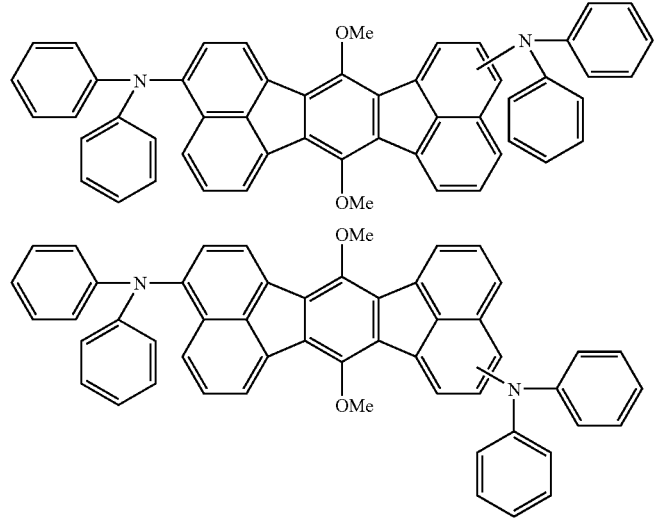
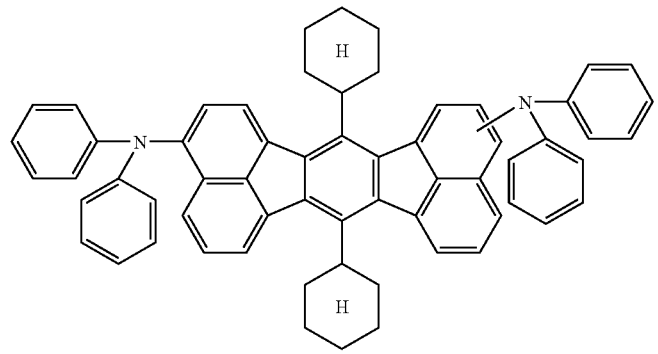

-continued
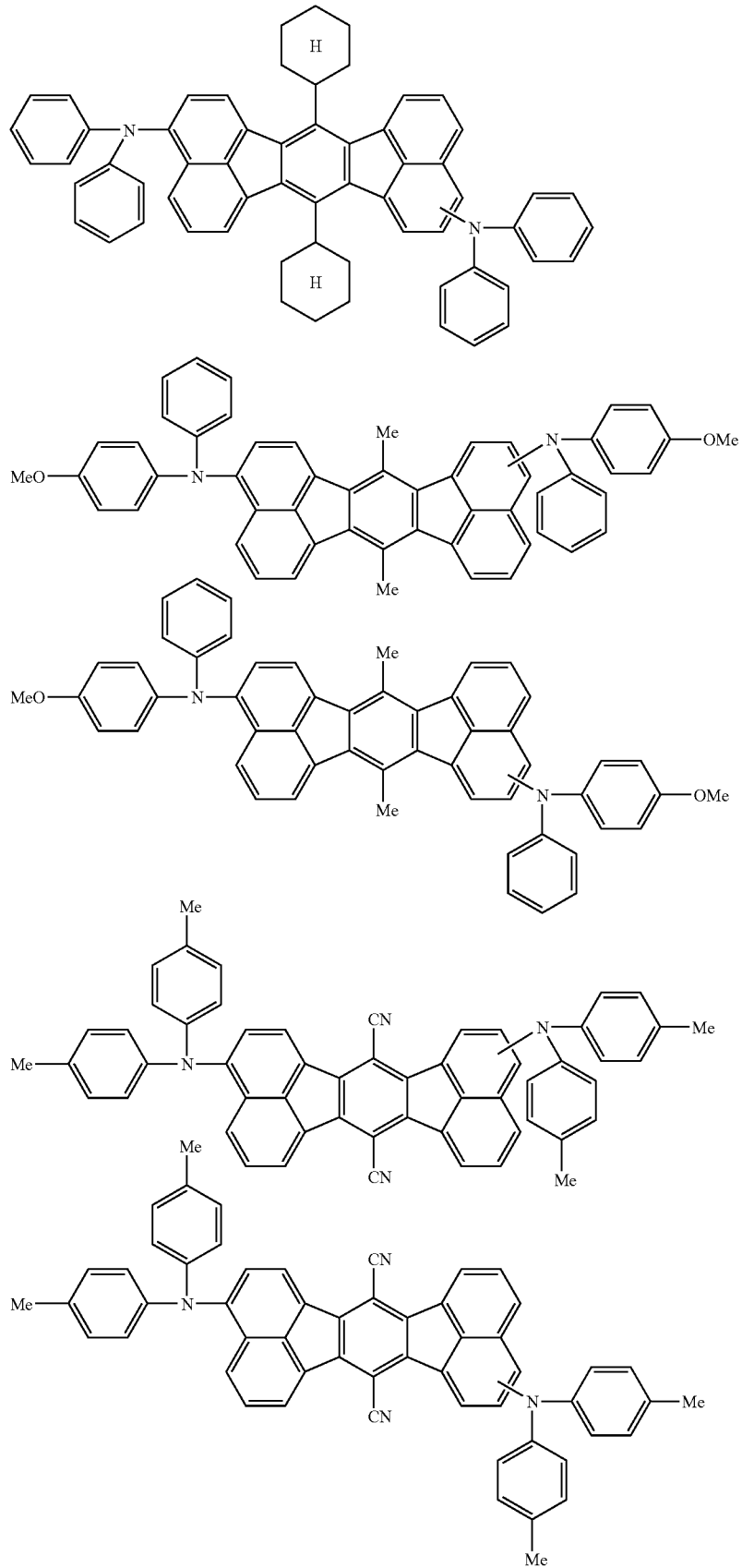

-continued

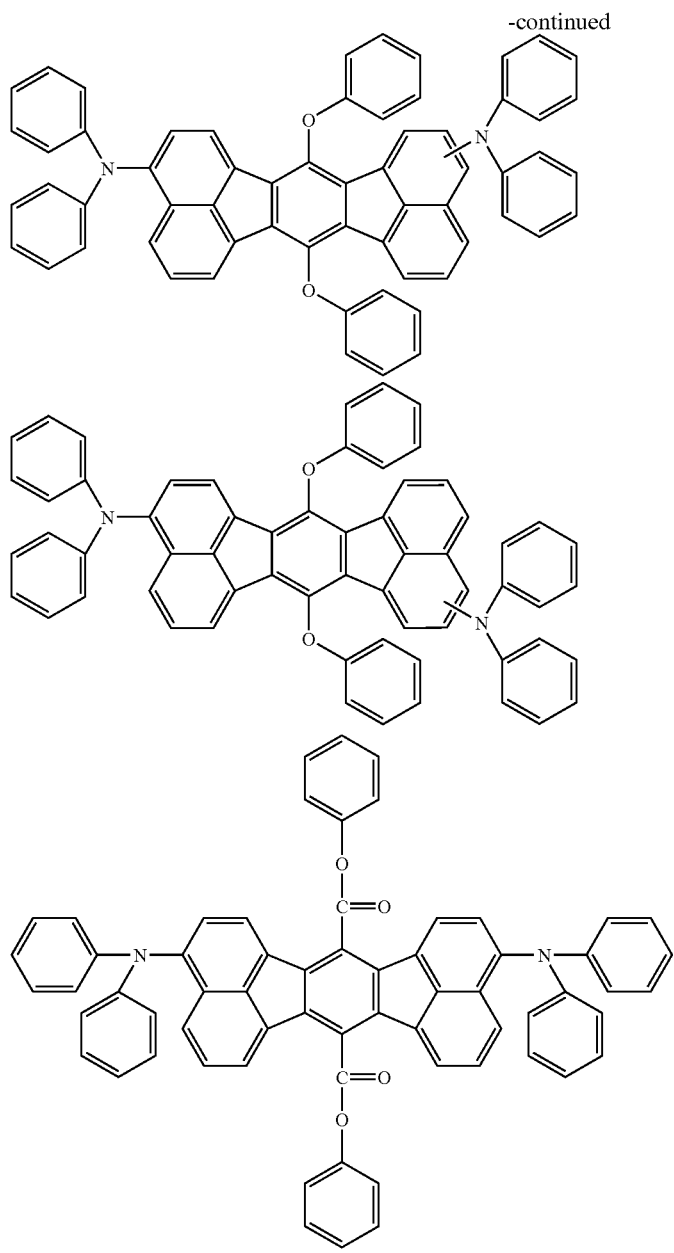

The ratio of the first dopant to the first host material is preferably 0.1 to 10% by mol, in particular preferably 1 to 10% by mol. If the ratio is less than 0.1% by mol, sufficient luminescence cannot be obtained. If the ratio is more than 10% by mol, concentration quenching is caused so that the luminescent efficiency may lower.

The ratio of the second dopant to the second host material is preferably 0.1 to 10% by mol, in particular preferably 0.1 to 5% by mol.

The film thickness of the first emitting layer is preferably 10 nm or more, in particular preferably 10 nm to 40 nm. If the film thickness is less than 10 nm, there is a possibility that holes at a high concentration reach the second emitting layer so that the second emitting layer emits stronger light than required and the color purity thereof deteriorates. Accordingly, the first emitting layer can be made thicker than the second emitting layer.

The film thickness of the second emitting layer is adjusted in accordance with the first emitting layer. The thickness is preferably 10 nm to 40 nm, in particular preferably 10 nm to 30 nm.

As the method for forming the emitting layers, a known method such as vapor deposition, spin coating or LB technique can be used. The emitting layers are each preferably a molecule-deposited film.

The molecule-deposited film is a thin film formed by precipitation and deposition from an ingredient compound in a gas phase state or a film formed by solidification from an ingredient compound in a solution state or a liquid phase state. This molecule-deposited film can be usually distinguished from the thin film formed by LB technique (the molecule-accumulated film) by difference in aggregation structure or high-order structure, or in functional difference resulting therefrom.

As disclosed in JP-A-S57-51781, the emitting layers can each be formed by dissolving an binder, such as resin, and an ingredient compound into a solvent to prepare a solution and then making this into a thin film by spin coating or the like.

The following describes the structure of the organic EL element of the present invention, and constituent elements thereof other than the emitting layers.

As long as the effects and advantages of the present invention are not damaged, another organic layer or other organic layers or one or more inorganic layers can be interposed between the first and second emitting layer, between the anode and the first emitting layer, or between the second emitting layer and the cathode.

Examples of the structure of the organic EL element of the invention include the following:

i) Anode/first emitting layer/second emitting layer/cathode, ii) Anode/hole injecting layer/first emitting layer/second emitting layer/cathode, iii) Anode/first emitting layer/second emitting layer/electron injecting layer/cathode, iv) Anode/hole injecting layer/first emitting layer/second emitting layer/electron injecting layer/cathode, v) Anode/organic semiconductor layer/first emitting layer/second emitting layer/cathode, vi) Anode/organic semiconductor layer/electron barrier layer/first emitting layer/second emitting layer/cathode, vii) Anode/organic semiconductor layer/first emitting layer/second emitting layer/adhesion improving layer/cathode, viii) Anode/hole injecting layer/hole transporting layer/first emitting layer/second emitting layer/electron injecting layer/cathode, ix) Anode/insulator layer/first emitting layer/second emitting layer/insulator layer/cathode, x) Anode/inorganic semiconductor layer/insulator layer/first emitting layer/second emitting layer/insulator layer/cathode, xi) Anode/organic semiconductor layer/insulator layer/first emitting layer/second emitting layer/insulator layer/cathode, xii) Anode/insulator layer/hole injecting layer/hole transporting layer/first emitting layer/second emitting layer/insulator layer/cathode, and xiii) Anode/insulator layer/hole injecting layer/hole transporting layer/first emitting layer/second emitting layer/electron injecting layer/cathode.

Usually, the structure viii) out of these is preferably used.

(1) Transparent Substrate

The organic EL element of the present invention is formed on a transparent substrate. The transparent substrate is a substrate for supporting the organic EL element, and is preferably a flat or smooth substrate having a transmittance of 50% or more to light rays within visible ranges of 400 to 700 nm.

Specific examples thereof include a glass plate and a polymer plate. Examples of the glass plate include soda-lime glass, barium/strontium-containing glass, lead glass, aluminosilicate glass, borosilicate glass, barium borosilicate glass, and quartz. Examples of the polymer plate include polycarbonate, acrylic polymer, polyethylene terephthalate, polyethersulfide, and polysulfone.

(2) Anode

The anode of the organic thin film EL element plays a role for injecting holes into its hole transporting layer or emitting layer. The anode effectively has a work function of 4.5 eV or more. Specific examples of the material of the anode used in the present invention include indium tin oxide alloy (ITO), tin oxide (NESA), gold, silver, platinum, and copper. The cathode is preferably made of a material having a small work function for injecting electrons into an electron transporting layer or emitting layer.

The anode can be formed by forming these electrode materials into a thin film by vapor deposition, sputtering or the like.

In the case where luminescence from the emitting layer is taken out through the anode, the transmittance of the anode to the luminescence is preferably more than 10%. The sheet resistance of the anode is preferably several hundreds $\Omega/\square$ or less. The film thickness of the anode, which is varied in accordance with the material thereof, is usually from 10 nm to 1 μm, preferably from 10 to 200 nm.

(3) Hole Injecting, Transporting Layer

The hole injecting, transporting layer is a layer for helping the injection of holes into the emitting layer so as to transport the holes to a light emitting region. The hole mobility thereof is large and the ionization energy thereof is usually as small as 5.5 eV or less. Such a hole injecting, transporting layer is preferably made of a material which can transport holes to the emitting layer at a lower electric field intensity. The hole mobility thereof is preferably at least $10^{-4}$ cm$^2$/V·second when an electric field of, e.g., $10^4$ to $10^6$ V/cm is applied.

The material for forming the hole injecting, transporting layer is not particularly limited so long as the material has the above-mentioned preferred natures. The material can be arbitrarily selected from materials which have been widely used as a hole transporting material in photoconductive materials and known materials used in a hole injecting layer of organic EL elements.

Specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrozoline derivatives and pyrozolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. Nos. 3,717,462, JP-A-54-59143, 55-52063, 55-52064, 55-46760, 55-85495, 57-11350, 57-148749 and 2-311591, and others), stylbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive macromolecular oligomers (in particular thiophene oligomers) disclosed in JP-A-1-211399.

The above-mentioned substances can be used as the material of the hole injecting layer. The following are preferably used: porphyrin compounds (disclosed in JP-A-63-2956965 and others), aromatictertiary amine compounds and styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), in particular, the aromatic tertiary amine compounds.

The following can also be given as examples: 4,4'-bis(N-(1-naphthyl)-N-phenylamino)biphenyl (hereinafter abbreviated to NPD), which has in the molecule thereof two condensed aromatic rings, disclosed in U.S. Pat. Nos. 5,061,569, and 4,4',4''-tris(N-(3-methylphenyl)-N-phenylamino)triphenylamine (hereinafter abbreviated to MTDATA), wherein three triphenylamine units are linked to each other in a starburst form, disclosed in JP-A-4-308688.

Inorganic compounds, such as p-type Si and p-type SiC, as well as the above-mentioned aromatic dimethylidene type compounds listed as the material of the emitting layer can also be used as the material of the hole injecting layer.

The hole injecting, transporting layer can be formed by making the above-mentioned compound(s) into a thin film by a known method, such as vacuum deposition, spin coating, casting or LB technique. The film thickness of the hole injecting, transporting layer is not particularly limited, and is usually from 5 nm to 5 μm. This hole injecting, transporting layer may be a single layer made of one or more out of the above-mentioned materials if this layer contains the compound of the present invention in its hole transporting zone. A hole injecting, transporting layer made of a compound different from that in the above-mentioned hole injecting, transporting layer may be laminated thereon.

The organic semiconductor layer is a layer for helping the injection of holes or electrons into the emitting layer, and is preferably a layer having an electroconductivity of $10^{-10}$ S/cm or more. The material of such an organic semiconductor layer may be an electroconductive oligomer, such as thiophene-containing oligomer or arylamine-containing oligomer disclosed in JP-A-8-193191, an electroconductive dendrimer such as arylamine-containing dendrimer.

(4) Electron Injecting Layer

The electron injecting layer is a layer for helping the injection of electrons into the emitting layer, and has a large electron mobility. The adhesion improving layer is a layer made of a material particularly good in adhesion to the cathode among such electron injecting layers.

The material used in the electron injecting layer is preferably a metal complex of 8-hydroxyquinoline or a derivative thereof, or a nitrogen-containing heterocyclic derivative.

Specific examples of the above-mentioned metal complex of 8-hydroxyquinoline or derivative include metal chelate oxynoid compounds each containing a chelate of oxine (generally, 8-quinolinol or 8-hydroxyquinoline).

For example, Alq described in the item of the luminescent material can be used in the electron injecting layer.

An example of the nitrogen-containing heterocyclic derivative is an oxadiazole derivative.

Examples of the oxadiazole derivative include electron transferring compounds represented by the following general formulas [3] to [5]:

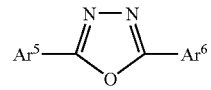

[3]

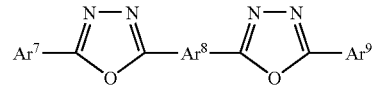

[4]

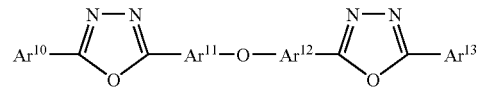

[5]

wherein $Ar^5$, $Ar^6$, $Ar^7$, $Ar^9$, $Ar^{10}$ and $Ar^{13}$ each represent a substituted or unsubstituted aryl group and may be the same as or different from each other, and $Ar^8$, $Ar^{11}$ and $Ar^{12}$ represent substituted or unsubstituted arylene groups and may be the same as or different from each other.

Examples of the aryl group include phenyl, biphenyl, anthranyl, perylenyl, and pyrenyl groups. Examples of the arylene group include phenylene, naphthylene, biphenylene, anthranylene, perylenylene, and pyrenylene groups. Examples of the substituent include alkyl groups with 1 to 10 carbons, alkoxy groups with 1 to 10 carbons, and a cyano group. The electron transferring compounds are preferably ones having capability of forming a thin film.

Specific examples of the electron transferring compounds include the following:

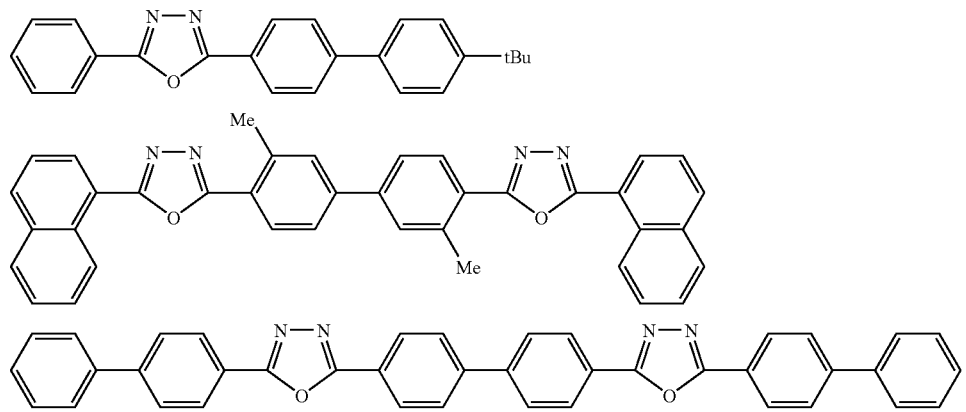

-continued

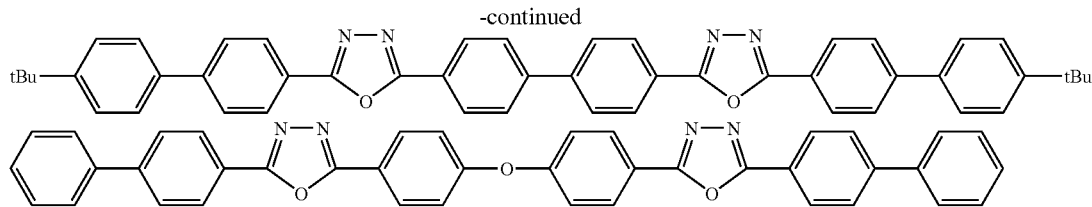

A different nitrogen-containing heterocyclic derivative organic compound may be a compound represented by a general formula [6]:

HAr-L$^1$-Ar$^{14}$—Ar$^{15}$ [6]

wherein HAr is a nitrogen-containing heterocyclic ring which has 3 to 40 carbons and may have a substituent, L$^1$ is a single bond, an arylene group which has 6 to 60 carbons and may have a substituent, a heteroarylene group which has 3 to 60 carbons and may have a substituent, or a fluorenylene group which may have a substituent, Ar$^{14}$ is a bivalent aromatic hydrocarbon group which has 6 to 60 carbons and may have a substituent, Ar$^{15}$ is an aryl group which has 6 to 60 carbons and may have a substituent or a heteroaryl group which has 3 to 60 carbons and may have a substituent.

The compound of the above-mentioned formula [6] can be synthesized by a method described in Japanese Patent Application No. 2003-004139.

This nitrogen-containing heterocyclic derivative organic compound of the formula [6] is preferably an imidazopyrazine derivative or an imidazole derivative.

Examples of the imidazopyrazine derivative include a compound represented by a general formula [7]:

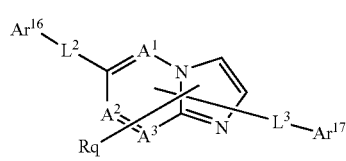

[7]

wherein A$^1$ to A$^3$ is a nitrogen atom or carbon atom; R is an aryl group which has 6 to 60 carbons and may have a substituent, a heteroaryl group which has 3 to 60 carbons and may have a substituent, an alkyl group which has 1 to 20 carbons, a haloalkyl group which has 1 to 20 carbons, or an alkoxy group which has 1 to 20 carbons; q is an integer of 0 to 5 and when q is an integer of 2 or more, Rs may be the same as or different from each other or Rs adjacent to each other may be bonded to each other to form a substituted or unsubstituted carbocyclic aliphatic ring or a substituted or unsubstituted carbocyclic aromatic ring; Ar$^{16}$ is an aryl group which has 6 to 60 carbons and may have a substituent, or a heteroaryl group which has 3 to 60 carbons and may have a substituent; Ar$^{17}$ is a hydrogen atom, an alkyl group which has 1 to 20 carbons, a haloalkyl group which has 1 to 20 carbons, an alkoxy group which has 1 to 20 carbons, an aryl group which has 6 to 60 carbons and may have a substituent, or a heteroaryl group which has 3 to 60 carbons and may have a substituent (provided that either one of Ar$^{16}$ and Ar$^{17}$ is a condensed cyclic group which has 10 to 60 carbons and may have a substituent or a condensed heterocyclic group which has 3 to 60 carbons and may have a substituent); L$^2$ and L$^3$ are each a single bond, a condensed cyclic group which has 10 to 60 carbons and may have a substituent, a condensed heterocyclic group which has 3 to 60 carbons and may have a substituent, or a fluorenylene group which may have a substituent.

The compound of the formula [7] can be synthesized by a method described in Japanese Patent Application No. 2003-005184.

Examples of the imidazole derivative include compounds represented by a general formula [8] or [9]:

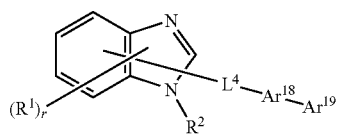

[8]

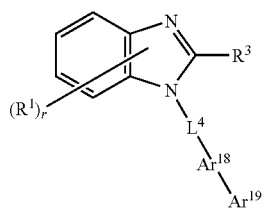

[9]

wherein R$^1$ is a hydrogen atom, an aryl group which has 6 to 60 carbons and may have a substituent, a pyridyl group which may have a substituent, a quinolyl group which may have a substituent, an alkyl group which has 1 to 20 carbons and may have a substituent, or an alkoxy group which has 1 to 20 carbons and may have a substituent; r is an integer of 0 to 4; R$^2$ is an aryl group which has 6 to 60 carbons and may have a substituent, a pyridyl group which may have a substituent, a quinolyl group which may have a substituent, an alkyl group which has 1 to 20 carbons and may have a substituent, or an alkoxy group which has 1 to 20 carbons and may have a substituent; R$^3$ is a hydrogen atom, an aryl group which has 6 to 60 carbons and may have a substituent, a pyridyl group which may have a substituent, a quinolyl group which may have a substituent, an alkyl group which has 1 to 20 carbons and may have a substituent, or an alkoxy group which has 1 to 20 carbons and may have a substituent; L$^4$ is an arylene group which has 6 to 60 carbons and may have a substituent, a pyridinylene group which may have a substituent, a quinolinylene group which may have a substituent, or a fluorenylene group which may have a substituent; Ar$^{18}$ is an arylene group which has 6 to 60 carbons and may have a substituent, a pyridinylene group which may have a substituent, or a quinolinylene group which may have a substituent; and Ar$^{19}$ is an aryl group which has 6 to 60 carbons and may have a substituent, a pyridyl group which may have a substituent, a quinolyl group which may have a substituent, an alkyl group which has 1 to 20 carbons and may have a substituent, or an alkoxy group which has 1 to 20 carbons and may have a substituent.

The compound of the formula [8] can be synthesized by a method described in Japanese Patent Application No. 2003-67847.

Specific examples of the nitrogen-containing heterocyclic derivative organic compound are illustrated below.

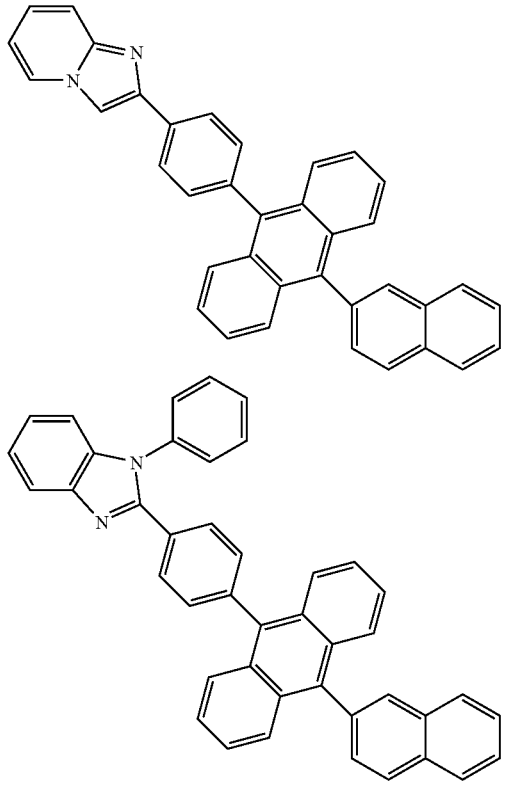

In the present invention, the electron injecting layer preferably has an electron mobility of $10^{-4}$ cm$^2$/(V·second) or more at an electric field intensity (E) of $10^4$ to $10^6$ V/cm. The use of the organic compound having such an electron mobility in the electron injecting layer makes the driving voltage of the organic EL element low.

Furthermore, the light emitting region can be shifted to the first emitting layer, which is at the side of the anode; therefore, the luminescence of the second emitting layer can be suppressed. Consequently, narrow band luminescence better in color purity can be obtained, and the efficiency of the EL element can be made high and the durability thereof can be made long.

It is therefore preferred to use, in the electron injecting layer, a compound particularly high in electron mobility, for example, the above-mentioned nitrogen-containing heterocyclic derivative organic compound, and in particular, the imidazopyrazine derivative and/or imidazole derivative.

If necessary, the above-mentioned compounds may be in the form of a lamination, a mixture or the like when forming the electron injecting layer.

A preferred embodiment of the present invention is an element comprising a reducing dopant in an interfacial region between its electron transferring region or cathode and its organic layer. The reducing dopant is defined as a substance which can reduce an electron transferring compound. Accordingly, various substances which have given reducing properties can be used. For example, at least one substance can be preferably used which is selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, alkali metal organic complexes, alkaline earth metal organic complexes, and rare earth metal organic complexes.

More specific examples of the preferred reducing dopants include at least one alkali metal selected from the group consisting of Na (work function: 2.36 eV), K (work function: 2.28 eV), Rb (work function: 2.16 eV) and Cs (work function: 1.95 eV), and at least one alkaline earth metal selected from the group consisting of Ca (work function: 2.9 eV), Sr (work function: 2.0 to 2.5 eV), and Ba (work function: 2.52 eV). Metals having a work function of 2.9 eV or less are in particular preferred. Among these, a more preferable reducing dopant is at least one alkali metal selected from the group consisting of K, Rb and Cs. Even more preferable is Rb or Cs. Most preferable is Cs.

These alkali metals are particularly high in reducing ability. Thus, the addition of a relatively small amount thereof to an electron injecting zone makes it possible to improve the luminance of the organic EL element and make the durability thereof long. As the reducing dopant having a work function of 2.9 eV or less, any combination of two or more out of these alkali metals is also preferred. Particularly preferred is any combination containing Cs, for example, a combination of Cs and Na, Cs and K, Cs and Rb, or Cs, Na and K. The combination containing Cs makes it possible to exhibit the reducing ability efficiently. The luminance of the organic EL element can be improved and the durability thereof can be made long by the addition thereof to its electron injecting zone.

In the present invention, an electron injecting layer made of an insulator or a semiconductor may be further formed between its cathode and organic layer. At this time, leakage of electric current is effectively prevented so that the electron injecting property can be improved. It is preferred to use, as such an insulator, at least one metal compound selected from the group consisting of alkali metal calcogenides, alkaline earth metal calcogenides, halides of alkali metals, and halides of alkaline earth metals. It is preferred that the electron injecting layer is made of one or more out of these alkali metal calcogenides and the like since the electron injecting property thereof can be further improved. Specifically, preferred examples of the alkali metal calcogenides include Li$_2$O, LiO, Na$_2$S, Na$_2$Se and NaO. Preferred examples of the alkaline earth metal calcogenides include CaO, BaO, SrO, BeO, BaS, and CaSe. Preferred examples of the halides of alkali metals include LiF, NaF, KF, LiCl, KCl, and NaCl. Preferred examples of the halides of alkaline earth metals include fluorides such as CaF$_2$, BaF$_2$, SrF$_2$, MgF$_2$, and BeF$_2$; and halides other than fluorides.

An electron transporting layer may be formed. Examples of the semiconductor constituting the electron transporting layer may be one or any combination of two or more out of oxides, nitrides or oxynitrides containing at least one of Ba, Ca, Sr, Yb, Al, Ga, In, Li, Na, Cd, Mg, Si, Ta, Sb and Zn. The inorganic compound constituting the electron transporting layer preferably forms a microcrystalline or amorphous insulator thin film. If the electron transporting layer is made of the insulator thin film, the thin film becomes a more homogenous thin film. Therefore, pixel defects such as dark spots can be decreased. Examples of such an inorganic compound include the above-mentioned alkali metal calcogenides, alkaline earth metal calcogenides, halides of alkali metals, and halides of alkaline earth metals.

(5) Cathode

For the cathode, the following may be used: an electrode substance made of a metal, an alloy or an electroconductive compound which has a small work function (4 eV or less), or a mixture thereof. Specific examples of the electrode substance include sodium, sodium-potassium alloy, magnesium, lithium, magnesium/silver alloy, aluminum/aluminum oxide, aluminum/lithium alloy, indium, and rare earth metals.

This cathode can be formed by making the electrode substance(s) into a thin film by vapor deposition, sputtering or some other method.

In the case where luminescence from the emitting layer is taken out through the cathode, it is preferred to make the transmittance of the cathode to the luminescence larger than 10%.

The sheet resistance of the cathode is preferably several hundreds $\Omega/\square$ or less, and the film thickness thereof is usually from 10 nm to 1 µm, preferably from 50 to 200 nm.

(6) Insulator Layer

In the organic EL element, pixel defects based on leakage or a short circuit are easily generated since an electric field is applied to the super thin film. In order to prevent this, it is preferred to insert an insulator thin layer between the pair of electrodes.

Examples of the material used in the insulator layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide.

A mixture or laminate thereof may be used.

The organic EL element can be produced by forming an anode and an emitting layer, optionally forming a hole injecting layer and an electron injecting layer, and further forming a cathode by use of the materials and methods exemplified above. The organic EL element can be produced in the order reverse to the above, i.e., the order from a cathode to an anode.

An example of the production of the organic EL element will be described below which has a structure wherein the following are successively formed over a transparent substrate: anode/hole injecting layer/emitting layer/electron injecting layer/cathode.

First, a thin film made of an anode material is formed into a thickness of 1 µm or less, preferably 10 to 200 nm on an appropriate transparent substrate by vapor deposition, sputtering or some other method, thereby forming an anode.

Next, a hole injecting layer is formed on this anode. As described above, the hole injecting layer can be formed by vacuum deposition, spin coating, casting, LB technique, or some other method. Vacuum deposition is preferred since a homogenous film is easily obtained and pinholes are not easily generated. In the case where the hole injecting layer is formed by vacuum deposition, conditions for the deposition are varied in accordance with the used compound (the material for the hole injecting layer), the crystal structure or recombining structure of the hole injecting layer, and others. In general, the conditions are appropriately selected from the following: deposition source temperatures of 50 to 450° C., vacuum degrees of $10^{-7}$ to $10^{-3}$ torr, vapor deposition rates of 0.01 to 50 nm/second, substrate temperatures of −50 to 300° C., and film thicknesses of 5 nm to 5 µm.

Next, an emitting layer is disposed on the hole injecting layer. The emitting layer can be formed by using a desired organic luminescent material and making the material into a thin film by vacuum deposition, sputtering, spin coating, casting or some other method. Vacuum deposition is preferred since a homogenous film is easily obtained and pinholes are not easily generated. In the case where the emitting layer is formed by vacuum deposition, conditions for the deposition, which are varied dependently on the used compound, can be generally selected from conditions similar to those for the hole injecting layer.

Next, an electron injecting layer is formed on this emitting layer. Like the hole injecting layer and the emitting layer, the layer is preferably formed by vacuum deposition in order to obtain a homogenous film. Conditions for the deposition can be selected from conditions similar to those for the hole injecting layer and the emitting layer.

Lastly, a cathode is laminated thereon to obtain an organic EL element.

The cathode is made of a metal, and vapor deposition or sputtering may be used. However, vacuum deposition is preferred in order to protect underlying organic layers from being damaged when the cathode film is formed.

About the organic EL element production that has been described so far, it is preferred that the formation from the anode to the cathode is continuously carried out, using only one vacuuming operation.

The method for forming each of the layers in the organic EL element of the invention is not particularly limited. A forming method known, such as vacuum deposition or spin coating, can be used. The organic thin film layers can be formed by vacuum deposition, molecular beam deposition (MBE method), or a known method of applying a solution wherein one or more organic compounds are dissolved in a solvent, such as dipping, spin coating, casting, bar coating or roll coating.

The film thickness of each of the organic layers in the organic EL element of the invention is not particularly limited. In general, defects such as pinholes are easily generated when the film thickness is too small. Conversely, a high applied voltage becomes necessary to make the efficiency bad when the film thickness is too large. Usually, therefore, the film thickness is preferably in the range of several nanometers to one micrometer.

In the case where a DC voltage is applied to the organic EL element, luminescence can be observed when the polarity of the anode and that of the cathode are made positive and negative, respectively, and the voltage of 5 to 40 V is applied. Even if a voltage is applied thereto in the state that the polarities are reverse to the above, no electric current flows so that luminescence is not generated at all. In the case where an AC voltage is applied thereto, uniform luminescence can be observed only when the polarity of the anode and that of the cathode are made positive and negative, respectively. The waveform of the AC to be applied may be arbitrarily selected.

The organic EL element of the invention emits light having a narrow band and a high color purity, and is in particular excellent as an element emitting blue light. Furthermore, the durability thereof is also improved.

EXAMPLES

Examples of the present invention will be described in detail hereinafter. However, the invention is not limited to these examples.

The properties of compounds used in the examples and elements produced therein were evaluated by the following methods.

(1) Energy gap: It was measured from an absorption edge of the absorption spectrum thereof in benzene. Specifically, a commercially available visible ray/ultraviolet ray spectrophotometer was used to measure the absorption spectrum, and then the energy gap is calculated from the wavelength at which the rise-up of the absorption spectrum begins.

(2) Luminance: It was measured with a spectral radiance luminance meter (CS-1000, manufactured by Minolta Co., Ltd.).

(3) Luminescent intensity at the maximum luminescent wavelength:

Under the same conditions for the produced EL element, a monolayer film of a first emitting layer and that of a second emitting layer were each formed, and then a commercially available fluorescence measuring device was used to measure the fluorescence spectrum of each of the monolayers. From the resultant fluorescence spectrum of the first emitting layer, the fluorescence intensity Ia of the first emitting layer was measured at the maximum luminescent wavelength a of the first emitting layer. In the same way, from the resultant fluorescence spectrum of the second emitting layer, the fluorescence intensity Ib of the second emitting layer was measured at the maximum luminescent wavelength b of the second emitting layer.

In the case where the maximum luminescent wavelengths of the first and second emitting layers are sufficiently separated from each other, the luminescent intensities Ia and Ib at the wavelengths a and b in the emission spectrum of the EL element can be made approximate to I1 and I2, respectively.

In the case where the maximum luminescent wavelengths of the first and second emitting layers are close to each other, it is assumed that the emission spectrum of the whole of the EL element is equal to the sum of the emission spectrum of the first emitting layer and that of the second emitting layer.

Accordingly, about the resultant fluorescence spectrum of the first emitting layer, the fluorescence intensities IIa and IIb are measured at the wavelengths a and b, respectively. In the same way, about the fluorescence spectrum of the second emitting layer, the fluorescence intensities I2a and I2b are measured at the wavelengths a and b, respectively. I1 and I2 satisfy the following equations:

$$Ia = I1*I1a + I2*I2a, \text{ and}$$

$$Ib = I1*I1b + I2*I2b$$

From the above-mentioned equations, the ratio between I1 and I2 is obtained.

(4) Luminescent efficiency: It was calculated from the current density value and the luminance (100 nit) measured with a multi-meter.

(5) C.I.E chromaticity coordinates: The coordinates were obtained in the same way as in the item (2).

(6) Half life: The half life of an element sealed up was measured At an initial luminance of 1000 nit and a constant current (room temperature).

(7) Electron mobility: It was calculated by the time-of-flight method. Specifically, about an element having a structure of ITO/organic layer (e.g., an electron injecting layer, film thickness: 1-2 μm)/Al, the time characteristic of the transient current generated by light irradiation (the transient characteristic time) was measured, and then the electron mobility was calculated from the following equation:

Electron mobility=(Thickness of organic layer)$^2$/
(Transient characteristic time×Electric field intensity)

Compounds used in the examples are illustrated below.

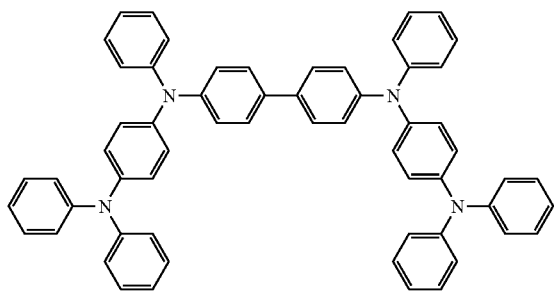

TPD232

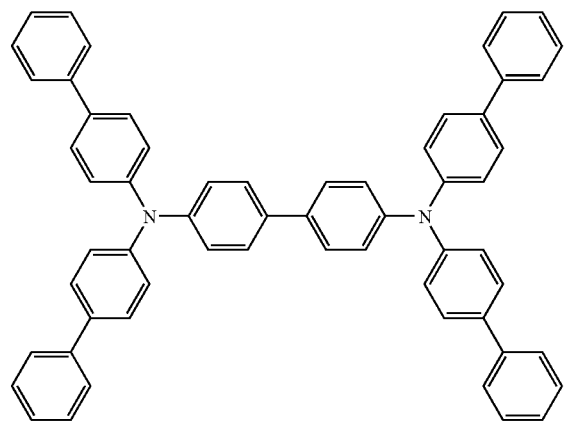

TBDB

D1
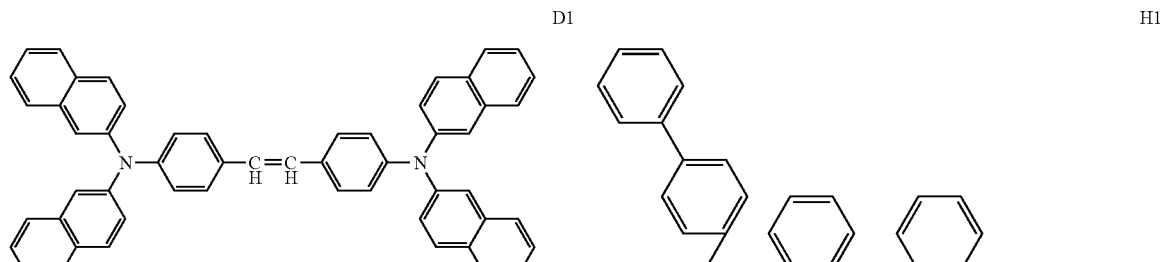
H1
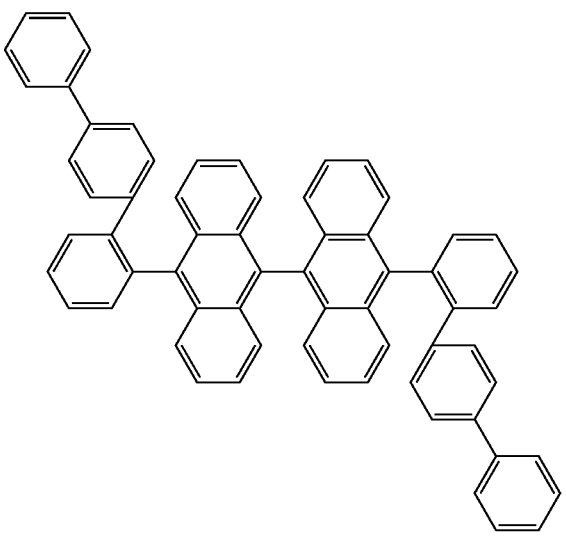
ETM-020
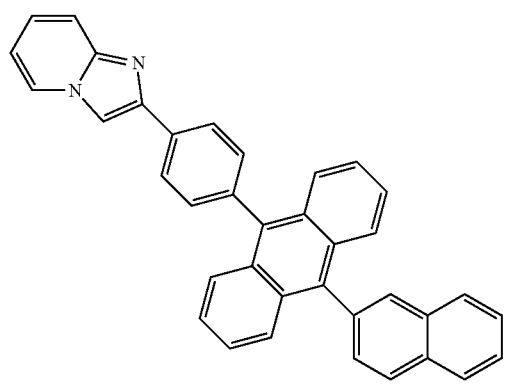
Alq
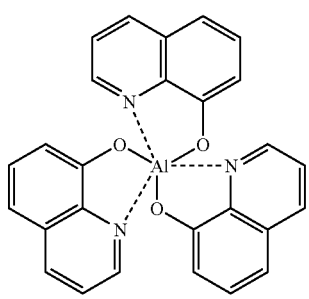
D2
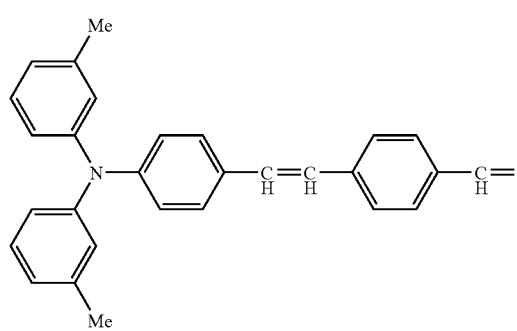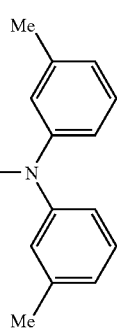

-continued

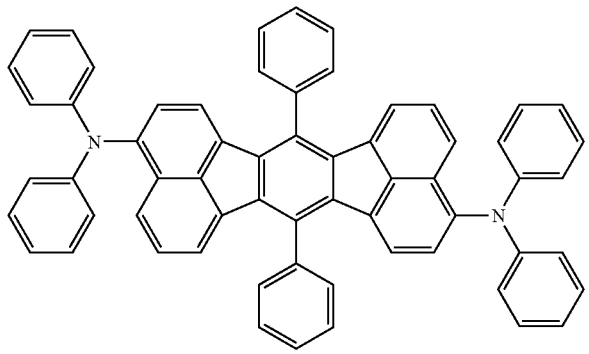

D3

Example 1

A glass substrate, 25 mm×75 mm×1.1 mm thick, having an ITO transparent electrode (manufactured by Geomatics Co.) was subjected to ultrasonic cleaning in isopropyl alcohol for 5 minutes followed by UV ozone cleaning for 30 minutes.

The washed glass substrate having the transparent electrode lines was set up on a substrate holder in a vacuum deposition device. First, an N,N'-bis(N,N'-diphenyl-4-aminophenyl)-N,N-diphenyl-4,4'-dia mino-1,1'-biphenyl film (abbreviated to the "TPD 232 film" hereinafter) was formed into a film in thickness of 60 nm on the surface on which the transparent electrode lines were formed, so as to cover the transparent electrode. This TPD 232 film functions as a hole injecting layer.

After the formation of the TPD 232 film, an N,N,N',N'-tetra (4-biphenyl)-diaminobiphenylene layer (abbreviated to the "TBDB layer" hereinafter) having a film thickness of 20 nm was formed on the TPD 232 film. This film functions as a hole transporting layer.

Furthermore, H1 as a host material of a first emitting layer and D1 as a first dopant thereof were vapor-deposited in a ratio of D1 to H1 of 1.0:20 (ratio by weight), thereby forming a layer having a film thickness of 20 nm (the first dopant: about 5.4% by mol). This layer functions as the first emitting layer.

Furthermore, H1 as a host material of a second emitting layer and D2 as a second dopant thereof were vapor-deposited in a ratio of D2 to H1 of 1.0:20 (ratio by weight), thereby forming a layer having a film thickness of 20 nm (the second dopant: about 5.7% by mol). This layer functions as the second emitting layer.

An Alq film having a film thickness of 10 nm was formed on this film. This functions as an electron injecting layer.

The electron mobility of Alq was $5\times10^{-6}$ cm$^2$/(V·second) (E=$5\times10^5$ V/cm).

Thereafter, Li (Li source, manufactured by Saesgetter Co.), which is a reducing dopant, and Alq were vapor-co-deposited to form an Alq:Li film (film thickness: 10 nm) as an electron injecting layer (cathode). Metal Al was vapor-deposited on this Alq:Li film to form a metal cathode, thereby forming an organic EL emitting layer.

Example 2

An organic EL element was produced (a first dopant: about 3.3% by mol, and a second dopant: about 5.3% by mol) in the same manner as in Example 1 except that the film thickness of the first emitting layer was 10 nm, the ratio of D1 to H1 was 0.3:10 (ratio by weight), the film thickness of the second emitting layer was 30 nm, and the ratio of D2 to H1 was 1.4:30 (ratio by weight).

Example 3

An organic EL element was produced (a first dopant: about 2.8% by mol, and a second dopant: about 5.7% by mol) in the same manner as in Example 1 except that the film thickness of the first emitting layer was 20 nm, the ratio of D1 to H1 was 0.5:20 (ratio by weight), the film thickness of the second emitting layer was 20 nm, and the ratio of D2 to H1 was 1.0:20 (ratio by weight).

Example 4

An organic EL element was produced (a first dopant: about 5.7% by mol, and a second dopant: about 4.8% by mol) in the same manner as in Example 1 except that the film thickness of the first emitting layer was 20 nm, D2 was used instead of D1, the ratio of D2 to H1 was 1.0:20 (ratio by weight), the film thickness of the second emitting layer was 20 nm, D3 was used instead of D2, and the ratio of D3 to H1 was 1.0:20 (ratio by weight).

Example 5

An organic EL element was produced in the same manner as in Example 4 except that ETM-020 was used instead of Alq constituting the electron injecting layer.

The electron mobility of ETM-020 was $4\times10^{-4}$ cm$^2$/(V·second) (E=$5\times10^5$ V/cm).

Comparative Example 1

An organic EL element was produced (a first dopant: about 5.4% by mol, and a second dopant: 0% by mol) in the same manner as in Example 1 except that the film thickness of the first emitting layer was 20 nm, the ratio of D1 to H1 was 1.0:20 (ratio by weight), the film thickness of the second emitting layer was 20 nm, and D2 was not used.

Comparative Example 2

An organic EL element was produced (a first dopant: about 5.7% by mol, and a second dopant: 0% by mol) in the same manner as in Example 1 except that the film thickness of the first emitting layer was 20 nm, D2 was used instead of D1, the ratio of D2 to H1 was 1.0:20 (ratio by weight), the film thickness of the second emitting layer was 20 nm, and D2 was not used.

Comparative Example 3

An organic EL element was produced (a first dopant: about 5.7% by mol, and a second dopant: about 5.4% by mol) in the same manner as in Example 1 except that the film thickness of the first emitting layer was 20 nm, D2 was used instead of D2, the ratio of D2 to H1 was 1.0:20 (ratio by weight), the film thickness of the second emitting layer was 20 nm, and the ratio of D1 to H1 was 1.0:20 (ratio by weight).

Comparative Example 4

An organic EL element was produced (a first dopant: about 4.8% by mol, and a second dopant: 0% by mol) in the same manner as in Example 1 except that the film thickness of the first emitting layer was 20 nm, D3 was used instead of D2, the ratio of D3 to H1 was 1.0:20 (ratio by weight), the film thickness of the second emitting layer was 20 nm, and D2 was not used.

Comparative Example 5

An organic EL element was produced (a first dopant: about 4.8% by mol, and a second dopant: about 5.7% by mol) in the same manner as in Example 1 except that the film thickness of the first emitting layer was 20 nm, D3 was used instead of D2, the ratio of D3 to H1 was 1.0:20 (ratio by weight), and the ratio of D2 to H1 was 1.0:20 (ratio by weight), Comparative Example 6

An organic EL element was produced in the same way as in Example 5 except that the second emitting layer was made to have the same structure as that of the first emitting layer.

About the organic EL elements of Examples 1 to 5 and Comparative Examples 1 to 6, the structure of the emitting layers of each of the organic EL elements, the ratio (I1/I2) between the luminescent intensity (I1) of the emission spectrum originating from the first emitting layer at the maximum luminescent wavelength and the luminescent intensity (I2) of the emission spectrum originating from the second emitting layer at the maximum luminescent wavelength, the initial luminescent efficiency, the C.I.E chromaticity coordinates, and the half life were measured. The results are shown in Table 1.

TABLE 1

|  | First emitting layer (Egh/Egd1) | Second emitting layer (Egh/Egd2) | I 1/I 2 | Luminescent efficiency (cd/A) | C.I.E chromaticity coordinates | Half life |
|---|---|---|---|---|---|---|
| Example 1 | H1/D1 (3.0 eV/2.9 eV) | H1/D2 (3.0 eV/2.8 eV) | 80/20 | 6.7 | 0.15, 0.17 | 3,000 |
| Example 2 | H1/D1 (3.0 eV/2.9 eV) | H1/D2 (3.0 eV/2.8 eV) | 55/45 | 7.4 | 0.15, 0.20 | 3,500 |
| Example 3 | H1/D1 (3.0 eV/2.9 eV) | H1/D2 (3.0 eV/2.8 eV) | 80/20 | 6.3 | 0.15, 0.16 | 2,500 |
| Com. Example 1 | H1/D1 (3.0 eV/2.9 eV) | H1 (3.0 eV) | 100/0 | 5.3 | 0.15, 0.15 | 1,500 |
| Com. Example 2 | H1/D2 (3.0 eV/2.8 eV) | H1 (3.0 eV) | 100/0 | 11.5 | 0.16, 0.31 | 3,700 |
| Com. Example 3 | H1/D2 (3.0 eV/2.8 eV) | H1/D1 (3.0 eV/2.9 eV) | 100/0 | 11.9 | 0.16, 0.30 | 2,900 |
| Example 4 | H1/D2 (3.0 eV/2.8 eV) | H1/D3 (3.0 eV/2.6 eV) | 90/10 | 6.8 | 0.25, 0.26 | 13,000 |
| Com. Example 4 | H1/D3 (3.0 eV/2.6 eV) | H1 (3.0 eV) | 100/0 | 8.2 | 0.50, 0.48 | 15,000 |
| Com. Example 5 | H1/D3 (3.0 eV/2.6 eV) | H1/D2 (3.0 eV/2.8 eV) | 100/0 | 8.3 | 0.49, 0.48 | 14,000 |
| Example 5 | H1/D2 (3.0 eV/2.8 eV) | H1/D3 (3.0 eV/2.6 eV) | 100/0 | 13.5 | 0.16, 0.31 | 8,000 |
| Com. Example 6 | H1/D2 (3.0 eV/2.8 eV) | H1/D2 (3.0 eV/2.8 eV) | 100/0 | 10.0 | 0.16, 0.31 | 1,500 |

As can be understood from Table 1, the organic EL elements using only a dopant having a large energy gap were good in color purity but had a low luminescent efficiency and a short half life. Conversely, the organic EL elements using only a dopant having a small energy gap had a high luminescent efficiency and a long half life but were poor in color purity and unsuitable for full-color usage.

However, the organic EL elements of the present invention had improved durability and luminescent efficiency and had the substantially same color purity as compared with those using only a dopant having a large energy gap. Thus, the organic EL elements of the present invention are very suitable for full color usage.

Furthermore, in Examples 5 and 6, the use of ETM-020, which has a high electron mobility, in the electron injecting layer made it possible to emit light (I2=0) only from the first emitting layer. In this case, by the energy gaps of the first dopant and the second dopant satisfying the requirements of the present invention, the half life can be remarkably improved and the advantageous effects of the present invention are very satisfactory.

INDUSTRIAL APPLICABILITY

The present invention can provide an organic EL element which gives narrow band luminescence high in color purity and has a long durability.

The invention claimed is:

1. An organic electroluminescence element comprising:
   an anode;
   a first emitting layer comprising at least a first host material and a first dopant;
   a second emitting layer comprising at least a second host material and a second dopant;
   an electron injecting layer; and
   a cathode in the order mentioned,
   wherein the energy gap $E_{gh}1$ of the first host material, the energy gap $E_{gd}1$ of the first dopant, the energy gap $E_{gh}2$ of the second host material, and the energy gap $E_{gd}2$ of the second dopant satisfy the following formulas [i] to [iv];
   the luminescent intensity I1 at the maximum luminescent wavelength of an emission spectrum derived from the first emitting layer, and the luminescent intensity I2 at the maximum luminescent wavelength of an emission spectrum derived from the second emitting layer satisfy the following formula [v]; and
   the electron mobility of the electron injecting layer is $10^{-4}$ cm$^2$/(V·sec) or more:

$$E_{gh}1 > E_{gd}1 \quad [i]$$

$$E_{gh}2 > E_{gd}2 \quad [ii]$$

$$E_{gh}1 > E_{gd}2 \quad [iii]$$

$$E_{gh}1 > 2.7 eV \quad [iv]$$

$$I1 > 3.5 \times I2 \quad [v].$$

2. An organic electroluminescence element according to claim 1, wherein the following formula is satisfied:

$$I1 > 5 \times I2.$$

3. An organic electroluminescence element according to claim 1, wherein $E_{gd}2$ is more than 2.7 eV.

4. An organic electroluminescence element according to claim 1, wherein the ratio of the first dopant to the first host material is 0.1 to 10 mol % in the first emitting layer.

5. An organic electroluminescence element according to claim 1, wherein the ratio of the second dopant to the second host material is 0.1 to 10 mol % in the second emitting layer.

6. An organic electroluminescence element according to claim 1, wherein the first host material is the same as the second host material.

7. An organic electroluminescence element according to claim 1, wherein the first emitting layer has a film thickness of 10 nm or more.

8. An organic electroluminescence element according to claim 1, wherein the electron injecting layer comprises one or more organic compounds comprising a nitrogen-containing heterocyclic derivative.

9. An organic electroluminescence element according to claim 8, wherein the organic compound(s) is/are an imidazopyrazine derivative and/or an imidazole derivative.

10. The organic electroluminescence element according to claim 1, wherein at least one of the first host material and the second host material is a compound represented by a formula [1]:

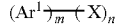

wherein $Ar^1$ is an aromatic ring with 6 to 50 nucleus carbons, X is a substituent, m is an integer of 1 to 5 and n is an integer of 0 to 6, provided that when m is 2 or more, the plurality of $Ar^1$ may be the same as or different from each other, and when n is 2 or more, the plurality of Xs may be the same as or different from each other.

11. The organic electroluminescence element according to claim 10, wherein $Ar^1$ is selected from the group consisting of phenyl, naphthyl, anthracene, acenaphthylene, fluorene, phenanthrene, fluoranthene, triphenylene, pyrene, chrysene, perylene, and trinaphthylene; and
   X is selected from the group consisting of substituted or unsubstituted aromatic groups with 6 to 50 nucleus carbons, substituted or unsubstituted aromatic heterocyclic groups with 5 to 50 nucleus carbons, substituted or unsubstituted alkyl groups with 1 to 50 carbons, substituted or unsubstituted alkoxy groups with 1 to 50 carbons, substituted or unsubstituted aralkyl groups with 1 to 50 carbons, substituted or unsubstituted aryloxy groups with 5 to 50 nucleus atoms, substituted or unsubstituted arylthio groups with 5 to 50 nucleus atoms, substituted or unsubstituted carboxyl groups with 1 to 50 carbons, substituted or unsubstituted styryl groups, halogen groups, a cyano group, a nitro group, and a hydroxyl group.

12. The organic electroluminescence element according to claim 1, wherein at least one of the first dopant and the second dopant is a compound represented by a formula [2]:

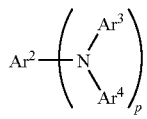

wherein each of $Ar^2$ to $Ar^4$ is a substituted or unsubstituted aromatic group with 6 to 50 nucleus carbons, or a substituted or unsubstituted styryl group; and p is an integer of 1 to 4; provided that when p is 2 or more, the plurality of $Ar^3$ and $Ar^4$ may be the same as or different from each other.

13. The organic electroluminescence element according to claim 12, wherein each of $Ar^2$ to $Ar^4$ is selected from the group consisting of phenyl, 1-naphthyl, 2-naphthyl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, o-tolyl, m-tolyl, p-tolyl, p-t-butylphenyl, 2-fluorenyl, 9,9-dimethyl-2-fluorenyl, 3-fluoranthenyl, 2-phenyl-1-vinyl, 2,2-diphenyl-1-vinyl, and 1,2,2-triphenyl-1-vinyl.

* * * * *